United States Patent
Tsai

(10) Patent No.: US 8,019,039 B1
(45) Date of Patent: Sep. 13, 2011

(54) SHIFT REGISTER CIRCUIT

(75) Inventor: Tsung-Ting Tsai, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/836,577

(22) Filed: Jul. 15, 2010

(30) Foreign Application Priority Data

May 10, 2010 (TW) .............................. 99114766 A

(51) Int. Cl.
    *G11C 19/00* (2006.01)
(52) U.S. Cl. ................ 377/64; 377/68; 377/78; 377/79
(58) Field of Classification Search .................... None
    See application file for complete search history.

(56) References Cited

U.S. PATENT DOCUMENTS

| | | | |
|---|---|---|---|
| 6,426,743 B1 | 7/2002 | Yeo | |
| 7,310,402 B2 | 12/2007 | Wei | |
| 7,317,780 B2 | 1/2008 | Lin | |
| 7,327,343 B2 * | 2/2008 | Lu et al. | 345/100 |
| 7,342,568 B2 | 3/2008 | Wei | |
| 7,688,934 B2 * | 3/2010 | Tsai et al. | 377/64 |
| 7,746,314 B2 * | 6/2010 | Wei et al. | 345/100 |
| 2007/0030239 A1 | 2/2007 | Guo | |
| 2007/0086558 A1 * | 4/2007 | Wei et al. | 377/64 |
| 2009/0304139 A1 * | 12/2009 | Tsai et al. | 377/79 |
| 2011/0007863 A1 * | 1/2011 | Tsai et al. | 377/79 |
| 2011/0044423 A1 * | 2/2011 | Lin et al. | 377/64 |

* cited by examiner

*Primary Examiner* — Tuan T Lam
(74) *Attorney, Agent, or Firm* — Winston Hsu; Scott Margo

(57) ABSTRACT

A shift register includes plural shift register stages for providing plural gate signals to plural gate lines. Each shift register stage includes a pull-up unit, an input unit, an energy-store unit, a discharging unit and a pull-down unit. The pull-up unit pulls up a first gate signal according to a driving control voltage and a first clock. The input unit is utilized for inputting a second gate signal generated by a preceding shift register stage to become a driving control voltage which is stored in the energy-store unit. The discharging unit is utilized for performing an alternate pull-down operation on the driving control voltage according to a second clock and a third clock. The pull-down unit is utilized for performing an alternate pull-down operation on the first gate signal according to the second and third clocks.

18 Claims, 21 Drawing Sheets

SHIFT REGISTER CIRCUIT

BACKGROUND OF THE INVENTION

1. Field of the Invention

The present invention relates to a shift register circuit, and more particularly, to a shift register circuit capable of reducing current leakage and mitigating voltage stress.

2. Description of the Prior Art

Along with the advantages of thin appearance, low power consumption and low radiation, liquid crystal displays (LCDs) have been widely applied in various electronic products for panel displaying. The operation of a liquid crystal display is featured by varying voltage drops between opposite sides of a liquid crystal layer for twisting the angles of the liquid crystal molecules in the liquid crystal layer so that the transmittance of the liquid crystal layer can be controlled for illustrating images with the aid of light source provided by a backlight module. In general, the liquid crystal display comprises plural pixel units, a shift register circuit, and a source driver. The source driver is utilized for providing plural data signals to be written into the pixel units. The shift register circuit comprises a plurality of shift register stages which are employed to generate plural gate signals for controlling the operations of writing the data signals into the pixel units. That is, the shift register circuit is a crucial device for providing a control of writing the data signals into the pixel units.

FIG. 1 is a schematic diagram showing a prior-art shift register circuit. As shown in FIG. 1, the shift register circuit 100 comprises a plurality of shift register stages and, for ease of explanation, illustrates an (N−1)th shift register stage 111, an Nth shift register stage 112 and an (N+1)th shift register stage 113. Each shift register stage is employed to generate one corresponding gate signal furnished to one corresponding gate line based on a first clock CK1 or a second clock CK2 having a phase opposite to the first clock CK1. For instance, the (N−1)th shift register stage 111 is employed to generate a gate signal SGn−1 furnished to a gate line GLn−1 based on the second clock CK2, the Nth shift register stage 112 is employed to generate a gate signal SGn furnished to a gate line GLn based on the first clock CK1, and the (N+1)th shift register stage 113 is employed to generate a gate signal SGn+1 furnished to a gate line GLn+1 based on the second clock CK2. The Nth shift register stage 112 comprises a pull-up unit 120, an input unit 130, an energy-store unit 125, a discharging unit 140, a pull-down unit 150, and a control unit 160. The pull-up unit 120 pulls up the gate signal SGn according to a driving control voltage VQn. The discharging unit 140 and the pull-down unit 150 are utilized for pulling down the driving control voltage VQn and the gate signal SGn respectively according to a pull-down control voltage Vdn generated by the control unit 160.

In the operation of the Nth shift register circuit 112, when the driving control voltage VQn is not pulled up to high-level voltage, since both the low-level voltages of the driving control voltage VQn and the gate signal SGn are the low power voltage Vss, the current leakage event of the pull-up unit 120 may occur due to the ripple of the driving control voltage VQn which is caused by the rising and falling edges of the first clock CK1 via a capacitive coupling effect based on the device capacitor of the pull-up unit 120. Accordingly, the voltage level of the gate signal SGn is likely to drift significantly, which degrades the image quality of the liquid crystal display. In another aspect, when the driving control voltage VQn is not pulled up to high-level voltage, the pull-down control voltage Vdn is retained to around the high power voltage Vdd so as to continue turning on the transistors of the discharging unit 140 and the pull-down unit 150 for continuously pulling down the driving control voltage VQn and the gate signal SGn. That is, the transistors of the discharging unit 140 and the pull-down unit 150 suffer high voltage stress in most of operating time, which is likely to incur an occurrence of threshold voltage shift. Besides, when the pull-down control voltage Vdn is pulled down to the low power voltage Vss, the two transistors of the control unit 160 are both turned on, which causes high power consumption and in turn raises working temperature. In view of that, the reliability and lifetime of the shift register circuit 100 are then downgraded.

SUMMARY OF THE INVENTION

In accordance with an embodiment of the present invention, a shift register circuit is disclosed for providing plural gate signals to plural gate lines. The shift register circuit comprises a plurality of shift register stages. And an Nth shift register stage of the shift register stages comprises a pull-up unit, an input unit, an energy-store unit, a discharging unit, and a pull-down unit. The pull-up unit, electrically connected to an Nth gate line of the gate lines, is utilized for pulling up an Nth gate signal of the gate signals according to a driving control voltage and a first clock. The input unit, electrically connected to the pull-up unit and an (N−1)th shift register stage of the shift register stages, is utilized for inputting an (N−1)th gate signal generated by the (N−1)th shift register stage to become the driving control voltage. The energy-store unit, electrically connected to the pull-up unit and the input unit, is employed to store the driving control voltage. The discharging unit, electrically connected to the energy-store unit, is utilized for performing an alternate pull-down operation on the driving control voltage according to a second clock and a third clock. The pull-down unit, electrically connected to the Nth gate line, is utilized for performing an alternate pull-down operation on the Nth gate signal according to the second clock and the third clock. In the operation of the shift register circuit, the pulse rising edges of the first through third clocks are sequentially staggered.

In accordance with another embodiment of the present invention, a shift register circuit is disclosed for providing plural gate signals to plural gate lines. The shift register circuit comprises a plurality of shift register stages. And an Nth shift register stage of the shift register stages comprises a pull-down unit, an input unit, an energy-store unit, a charging unit, and a pull-up unit. The pull-down unit, electrically connected to an Nth gate line of the gate lines, is utilized for pulling down an Nth gate signal of the gate signals according to a driving control voltage and a first clock. The input unit, electrically connected to the pull-down unit and an (N−1)th shift register stage of the shift register stages, is utilized for inputting an (N−1)th gate signal generated by the (N−1)th shift register stage to become the driving control voltage. The energy-store unit, electrically connected to the pull-down unit and the input unit, is employed to store the driving control voltage. The charging unit, electrically connected to the energy-store unit, is utilized for performing an alternate pull-up operation on the driving control voltage according to a second clock and a third clock. The pull-up unit, electrically connected to the Nth gate line, is utilized for performing an alternate pull-up operation on the Nth gate signal according to the second clock and the third clock. In the operation of the shift register circuit, the pulse falling edges of the first through third clocks are sequentially staggered.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
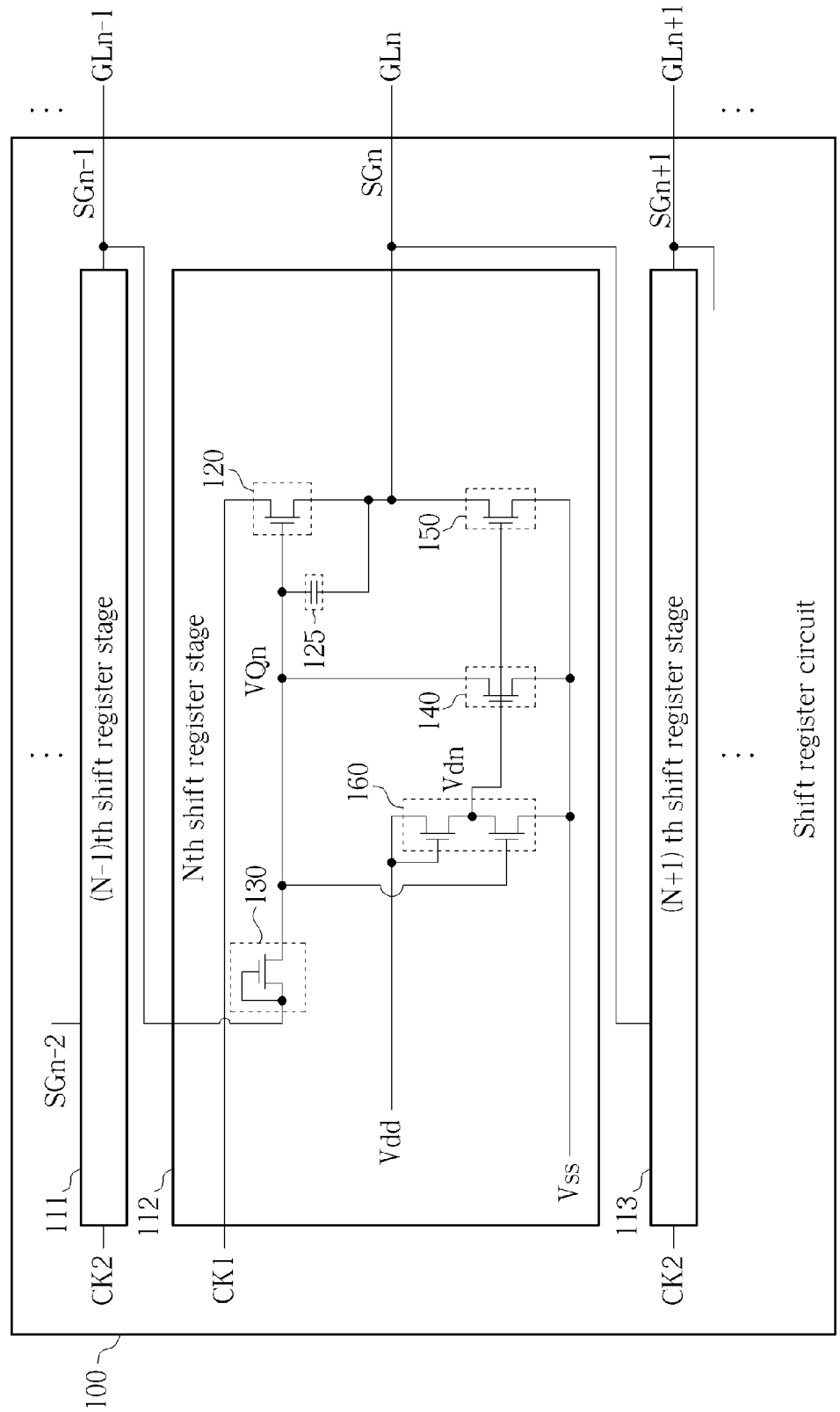
FIG. 1 is a schematic diagram showing a prior-art shift register circuit.
Figure 2:
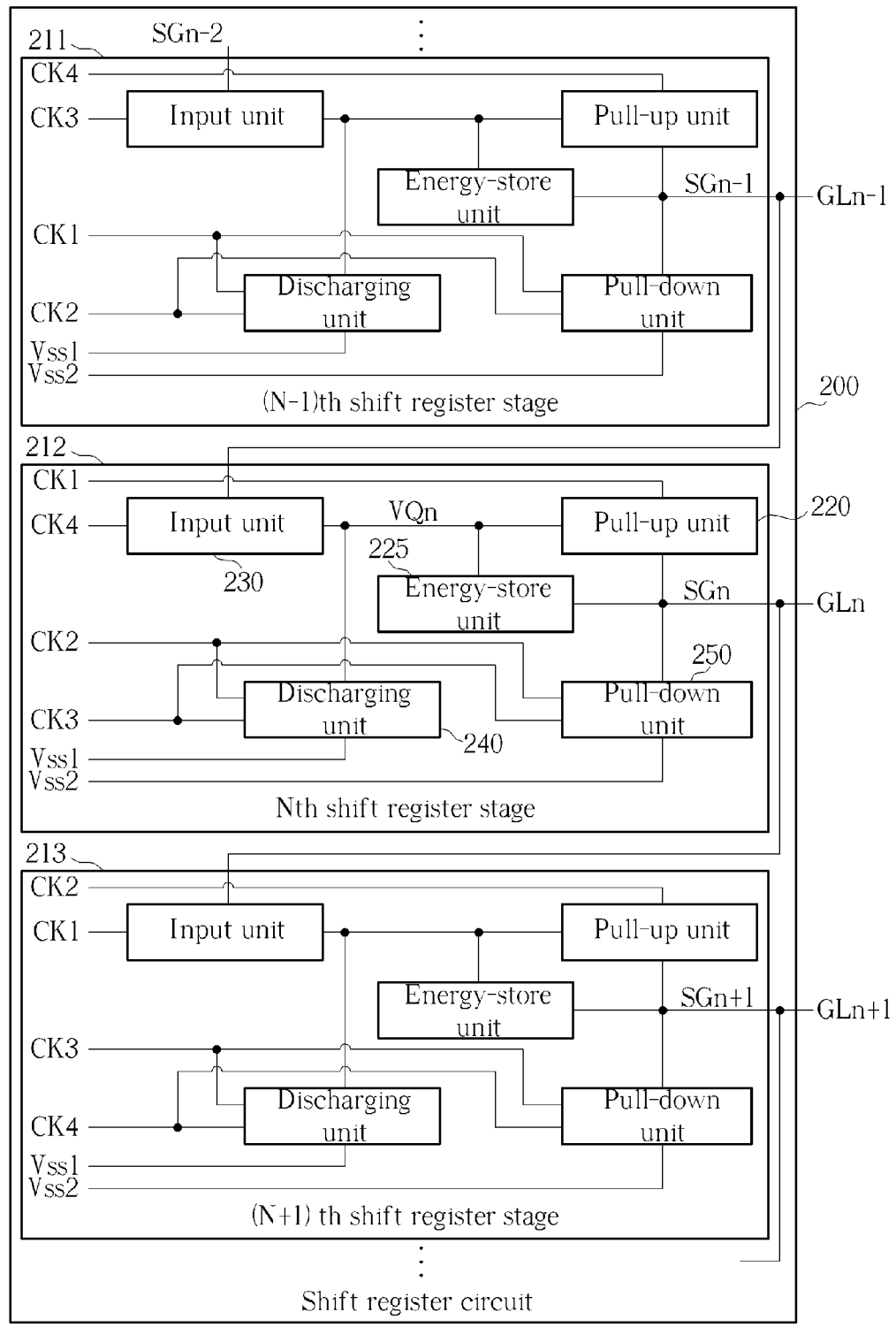
FIG. 2 is a schematic diagram showing a shift register circuit in accordance with a first embodiment of the present invention.

FIG. 2 is a schematic diagram showing a shift register circuit in accordance with a first embodiment of the present invention. As shown in FIG. 2, the shift register circuit 200 comprises a plurality of shift register stages and, for ease of explanation, illustrates an (N−1)th shift register stage 211, an Nth shift register stage 212 and an (N+1)th shift register stage 213. In the operation of the shift register circuit 200, each shift register stage provides one corresponding gate signal furnished to one corresponding gate line according to a first clock CK1, a second clock CK2, a third clock CK3 and a fourth clock CK4. For instance, the (N−1)th shift register stage 211 is employed to provide a gate signal SGn−1 furnished to a gate line GLn−1, the Nth shift register stage 212 is employed to provide a gate signal SGn furnished to a gate line GLn, and the (N+1)th shift register stage 213 is employed to provide a gate signal SGn+1 furnished to a gate line GLn+1. The internal structure of the Nth shift register stage 212 is detailed as the followings, and the other shift register stages can be inferred by analogy.

The Nth shift register stage 212 comprises a pull-up unit 220, an input unit 230, an energy-store unit 225, a discharging unit 240, and a pull-down unit 250. The pull-up unit 220, electrically connected to the gate line GLn, is utilized for pulling up the gate signal SGn of the gate line GLn according to a driving control voltage VQn and the first clock CK1. The input unit 230, electrically connected to the (N−1)th shift register stage 211, is utilized for inputting the gate signal SGn−1 to become the driving control voltage VQn. That is, the gate signal SGn−1 also functions as a start pulse signal for enabling the Nth shift register stage 212. The energy-store unit 225, electrically connected to the pull-up unit 220 and the input unit 230, is put in use for storing the driving control voltage VQn. The discharging unit 240, electrically connected to the energy-store unit 225, is employed to perform an alternate pull-down operation on the driving control voltage VQn according to the second clock CK2 and the third clock CK3, for pulling down the driving control voltage VQn to a first low power voltage Vss1. The pull-down unit 250, electrically connected to the gate line GLn, is employed to perform an alternate pull-down operation on the gate signal SGn according to the second clock CK2 and the third clock CK3, for pulling down the gate signal SGn to a second low power voltage Vss2. The second low power voltage Vss2 is greater than the first low power voltage Vss1.

Figure 3:
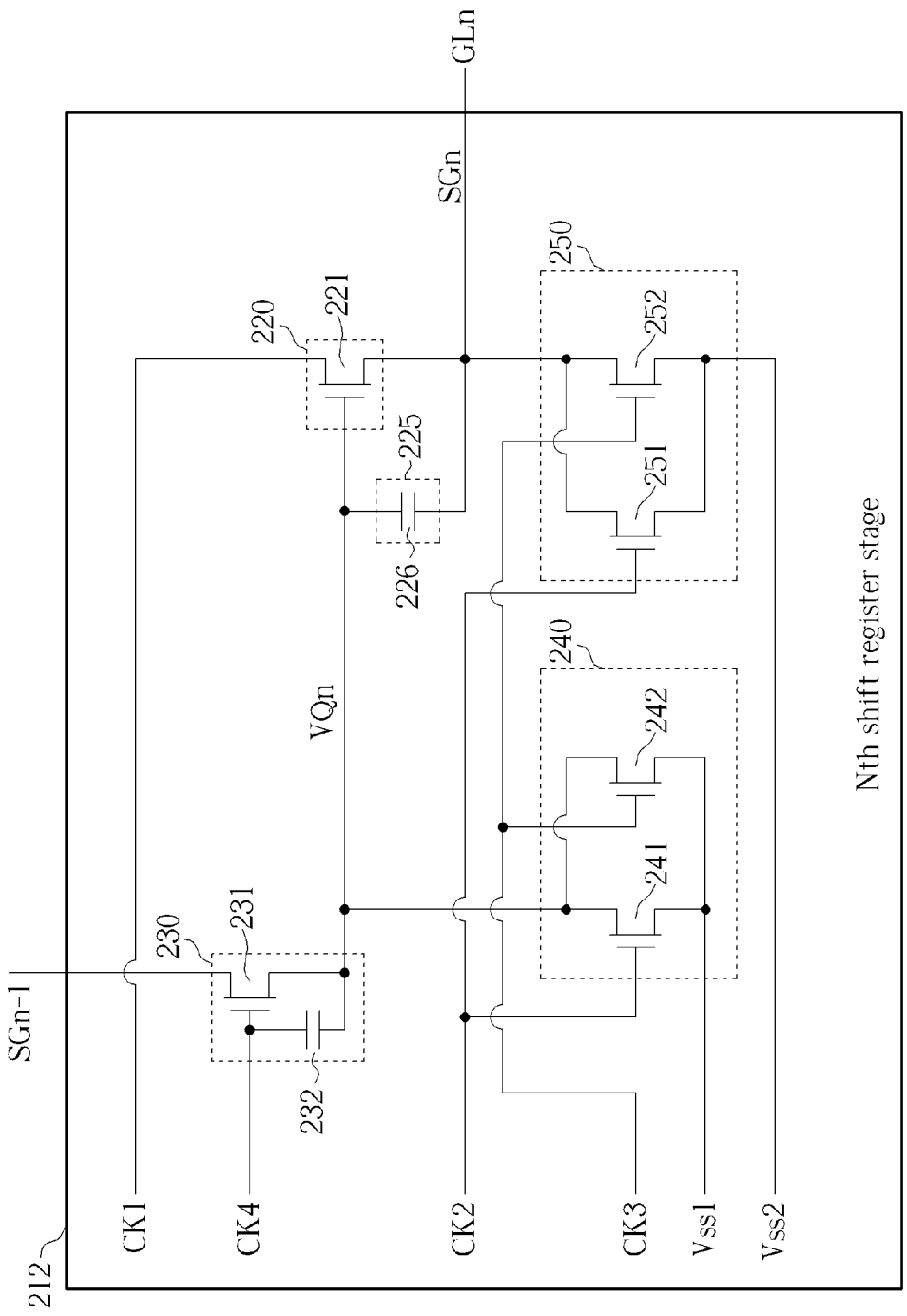
FIG. 3 is a circuit diagram illustrating the Nth shift register stage shown in FIG. 2.

FIG. 3 is a circuit diagram illustrating the Nth shift register stage shown in FIG. 2. Regarding the circuit embodiment of the Nth shift register stage 212 shown in FIG. 3, the pull-up unit 220 comprises a first transistor 221, the energy-store unit 225 comprises a first capacitor 226, the input unit 230 comprises a second transistor 231 and a second capacitor 232, the discharging unit 240 comprises a third transistor 241 and a fourth transistor 242, and the pull-down unit 250 comprises a fifth transistor 251 and a sixth transistor 252. The first transistor 221 through the sixth transistor 252 are N-type thin film transistors or N-type field effect transistors.

The second transistor 231 comprises a first end electrically connected to the (N−1)th shift register stage 211 for receiving the gate signal SGn−1, a gate end for receiving the fourth clock CK4, and a second end electrically connected to the energy-store unit 225 and the pull-up unit 220. The second capacitor 232 is electrically connected between the gate and second ends of the second transistor 231. The first transistor 221 comprises a first end for receiving the first clock CK1, a gate end electrically connected to the second end of the second transistor 231, and a second end electrically connected to the gate line GLn. The first capacitor 226 is electrically connected between the gate and second ends of the first transistor 221. The third transistor 241 comprises a first end electrically connected to the second end of the second transistor 231, a gate end for receiving the second clock CK2, and a second end for receiving the first low power voltage Vss1. The fourth transistor 242 comprises a first end electrically connected to the second end of the second transistor 231, a gate end for receiving the third clock CK3, and a second end for receiving the first low power voltage Vss1. The fifth transistor 251 comprises a first end electrically connected to the gate line GLn, a gate end for receiving the second clock CK2, and a second end for receiving the second low power voltage Vss2. The sixth transistor 252 comprises a first end electrically connected to the gate line GLn, a gate end for receiving the third clock CK3, and a second end for receiving the second low power voltage Vss2.

With the above in mind, it is obvious that the Nth shift register stage 212 is capable of employing the second clock CK2 and the third clock CK3 to alternately pull down the driving control voltage VQn and the gate signal SGn, and the control unit used in the prior art can be omitted accordingly, for reducing power consumption and lowering working temperature. For that reason, the reliability and life-time of the shift register circuit 200 can be enhanced. Since the third transistor 241 and the fourth transistor 242 are alternately turned on based on the second clock CK2 and the third clock CK3 respectively, the long-term high voltage stress on the third transistor 241 and the fourth transistor 242 is thus avoided for preventing an occurrence of threshold voltage shift. Correspondingly, since the fifth transistor 251 and the sixth transistor 252 are alternately turned on based on the second clock CK2 and the third clock CK3 respectively, the long-term high voltage stress on the fifth transistor 251 and the sixth transistor 252 is also avoided for preventing an occurrence of threshold voltage shift.

Figure 4:
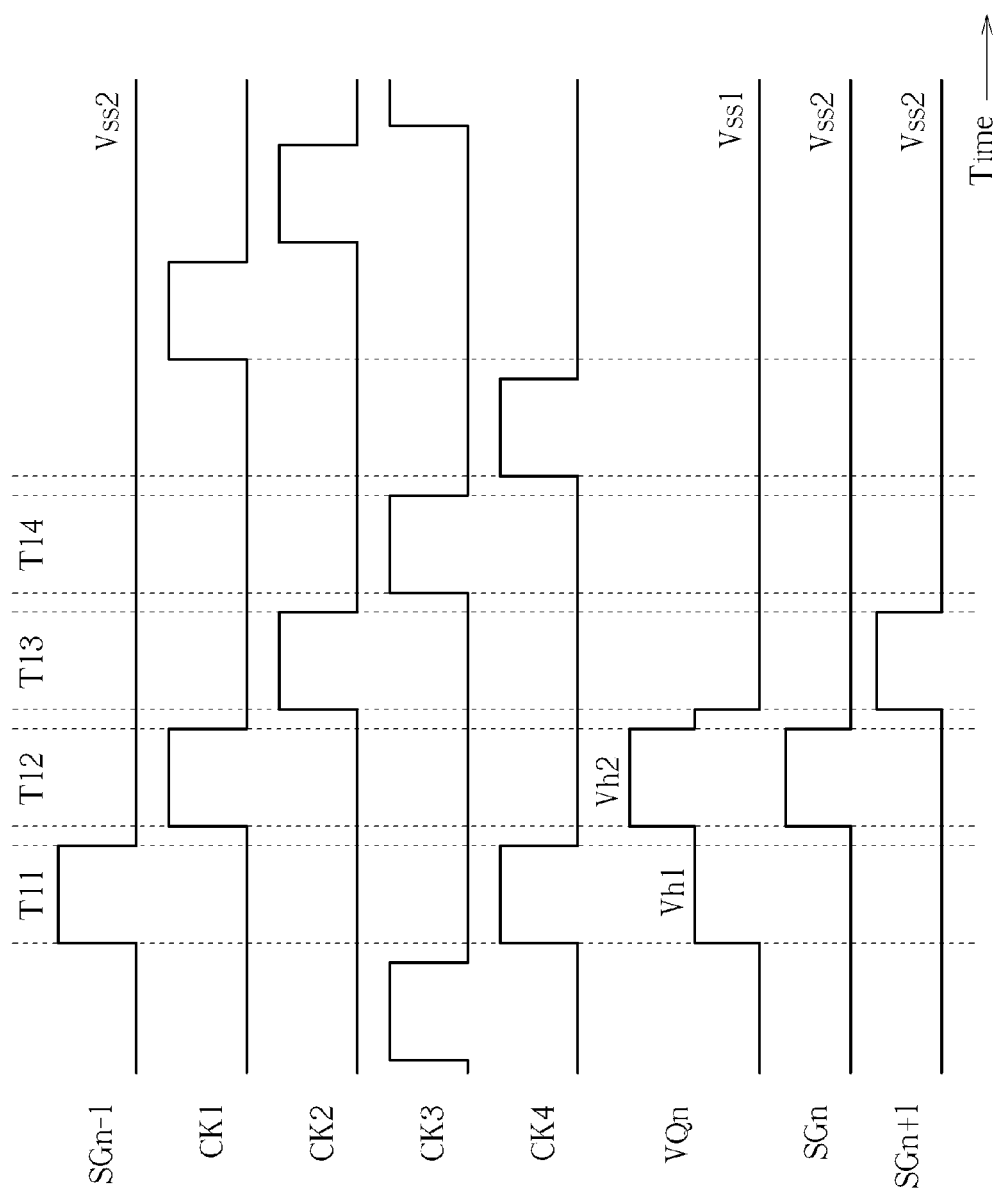
FIG. 4 is a schematic diagram showing related signal waveforms regarding the operation of the shift register circuit illustrated in FIGS. 2-3, having time along the abscissa.

FIG. 4 is a schematic diagram showing related signal waveforms regarding the operation of the shift register circuit illustrated in FIGS. 2-3, having time along the abscissa. The signal waveforms in FIG. 4, from top to bottom, are the gate signal SGn−1, the first clock CK1, the second clock CK2, the third clock CK3, the fourth clock CK4, the driving control voltage VQn, the gate signal SGn, and the gate signal SGn+1. It is noted that the pulse rising edges of the first through fourth clocks CK1-CK4 are sequentially staggered. In one preferred embodiment, the high-level pulses of the first through fourth clocks CK1-CK4 are not overlapped to each other.

As shown in FIG. 4, during an interval T11, both the gate signal SGn−1 and the fourth clock CK4 is shifting from low-level voltage to high-level voltage, the second transistor 231 is then turned on for boosting the driving control voltage VQn from low-level voltage to a first high voltage Vh1. During an interval T12, since the fourth clock CK4 is lowered and holds low-level voltage, the second transistor 231 is turned off and the driving control voltage VQn therefore becomes a floating voltage. Concurrently, along with the switching of the first clock CK1 from low-level voltage to high-level voltage, the driving control voltage VQn is further boosted from the first high voltage Vh1 to a second high voltage Vh2 due to a capacitive coupling effect caused by the device capacitor of the first transistor 221. Accordingly, the first transistor 221 is turned on for pulling up the gate signal SGn from low-level voltage to high-level voltage.

During an interval T13, since the second clock CK2 is shifting up to high-level voltage, the third transistor 241 is turned on for pulling down the driving control voltage VQn to the first low power voltage Vss1, and the fifth transistor 251 is turned on for pulling down the gate signal SGn to the second low power voltage Vss2. Besides, by making use of the gate signal SGn as a start pulse signal, the (N+1)th shift register stage 213 is enabled to generate the gate signal SGn+1 having high-level voltage during the interval T13. During an interval T14, since the third clock CK3 is shifting up to high-level voltage, the fourth transistor 242 is turned on for pulling down the driving control voltage VQn to the first low power voltage Vss1, and the sixth transistor 252 is turned on for pulling down the gate signal SGn to the second low power voltage Vss2.

Thereafter, as long as the gate signal SGn continues holding low-level voltage, the Nth shift register stage 212 periodically repeats the aforementioned circuit operations during the intervals T13 and T14. That is, the third transistor 241 and the fourth transistor 242 are employed to alternately pull down the driving control voltage VQn to the first low power voltage Vss1 periodically, and the fifth transistor 251 and the sixth transistor 252 are employed to alternately pull down the gate signal SGn to the second low power voltage Vss2 periodically. And therefore the long-term high voltage stress on any transistor used for pull-down operation is avoided for preventing an occurrence of threshold voltage shift. Besides, since the second low power voltage Vss2 is greater than the first low power voltage Vss1, the first transistor 221 can be turned off completely so as to prevent current leakage for enhancing display quality when the gate signal SGn continues holding low-level voltage. Further, since the first transistor 221 is employed to pull up the gate signal SGn while the second transistor 231 is employed merely to input the gate signal SGn−1, the device size of the first transistor 221 is generally designed to be significantly greater than the device size of the second transistor 231, i.e. the device capacitor of the first transistor 221 is also significantly greater than the device capacitor of the second transistor 231. For that reason, the second capacitor 232 is added to compensate the device-capacitor difference between the second transistor 231 and the first transistor 221. Accordingly, with the aid of the coupling effect regarding both the second capacitor 232 and the device capacitor of the second transistor 231, the falling/rising edges of the fourth clock CK4 is then able to compensate the ripple of the driving control voltage VQn which is caused by the rising/falling edges of the first clock CK1 via the device capacitor of the first transistor 221.

Figure 5:
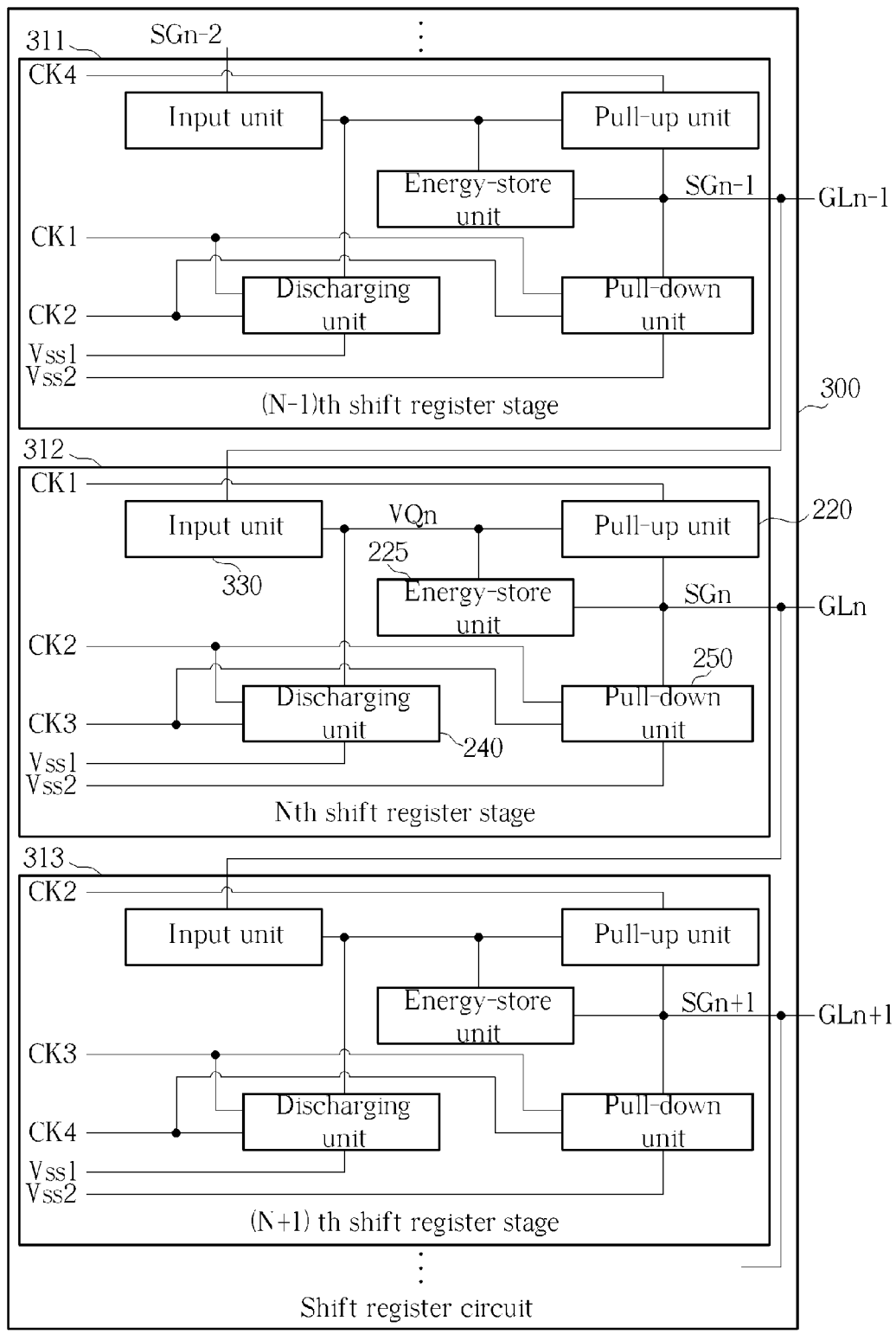
FIG. 5 is a schematic diagram showing a shift register circuit in accordance with a second embodiment of the present invention.

FIG. 5 is a schematic diagram showing a shift register circuit in accordance with a second embodiment of the present invention. As shown in FIG. 5, the shift register circuit 300 comprises a plurality of shift register stages and, for ease of explanation, illustrates an (N−1)th shift register stage 311, an Nth shift register stage 312 and an (N+1)th shift register stage 313. In the operation of the shift register circuit 300, the (N−1)th shift register stage 311 is utilized for providing a gate signal SGn−1 furnished to a gate line GLn−1 based on a first clock CK1, a second clock CK2 and a fourth clock CK4, the Nth shift register stage 312 is utilized for providing a gate signal SGn furnished to a gate line GLn based on the first clock CK1, the second clock CK2 and a third clock CK3, and the (N+1)th shift register stage 313 is utilized for providing a gate signal SGn+1 furnished to a gate line GLn+1 based on the second clock CK2, the third clock CK3 and the fourth clock CK4. The structure of the Nth shift register stage 312 is similarly to that of the Nth shift register stage 212 shown in FIG. 2, differing in that the input unit 230 is replaced with an input unit 330. The input unit 330, electrically connected to the (N−1)th shift register stage 311, is utilized for inputting the gate signal SGn−1 to become the driving control voltage VQn. It is noted that the input unit 330 is not controlled by the fourth clock CK4.

Figure 6:
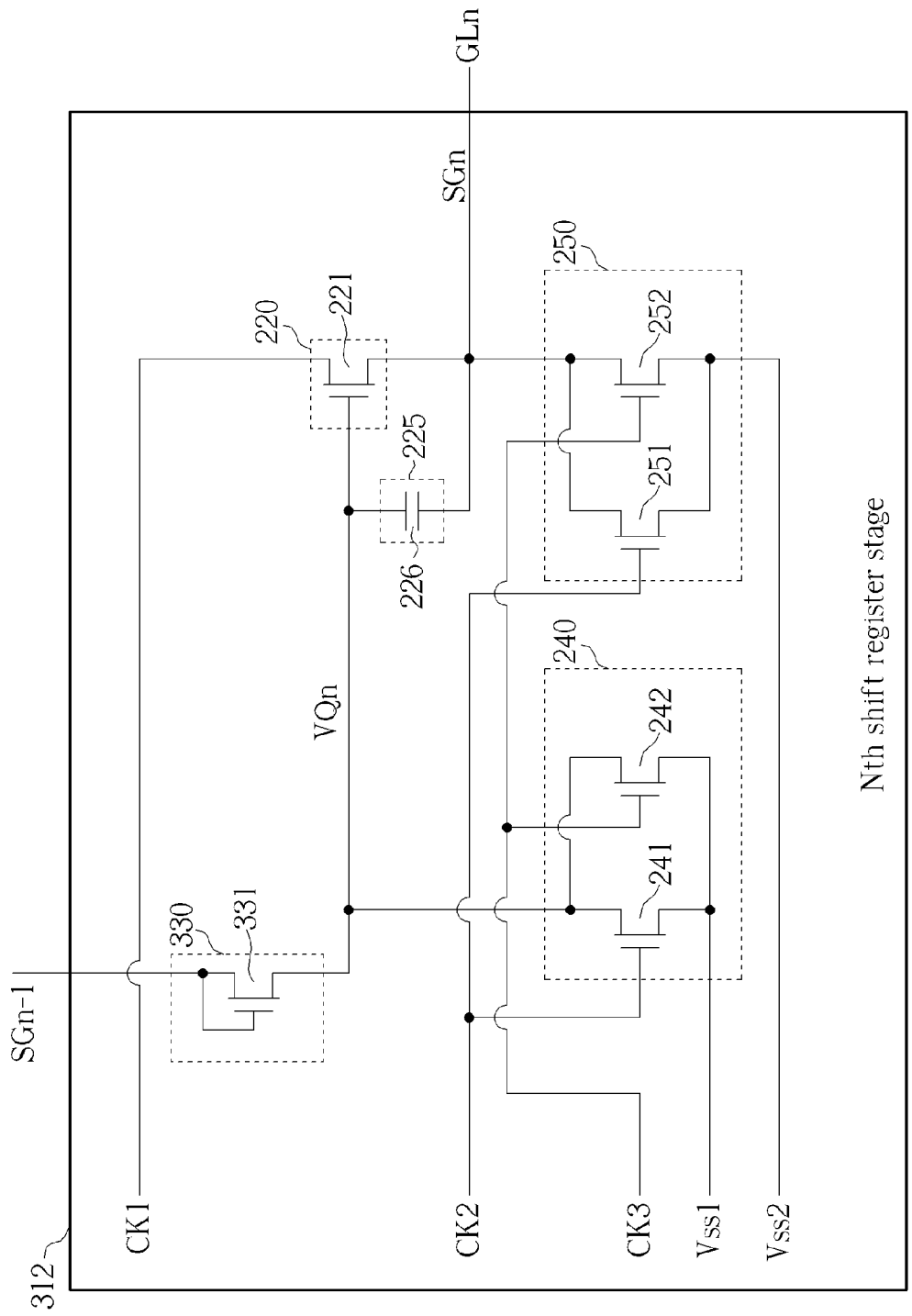
FIG. 6 is a circuit diagram illustrating the Nth shift register stage shown in FIG. 5.

FIG. 6 is a circuit diagram illustrating the Nth shift register stage shown in FIG. 5. Regarding the circuit embodiment of the Nth shift register stage 312 shown in FIG. 6, the input unit 330 comprises a second transistor 331 only, and the other units are identical to corresponding units of the Nth shift register stage 212 shown in FIG. 3. The second transistor 331 comprises a first end electrically connected to the (N−1)th shift register stage 311 for receiving the gate signal SGn−1, a gate end electrically connected to the first end, and a second end electrically connected to the energy-store unit 225 and the pull-up unit 220. Since the fourth clock CK4 is not furnished to the gate end of the second transistor 331, the ripple of the driving control voltage VQn, which is caused by the rising/falling edges of the first clock CK1 via the device capacitor of the first transistor 221, is not compensated. Accordingly, it is not required to dispose a second capacitor between the gate and second ends of the second transistor 331, for bringing the cost down. The signal waveforms regarding the operation of the shift register circuit 300 illustrated in FIGS. 5-6 are substantially identical to the signal waveforms shown in FIG. 4 and, for the sake of brevity, further similar discussion thereof is omitted.

Figure 7:
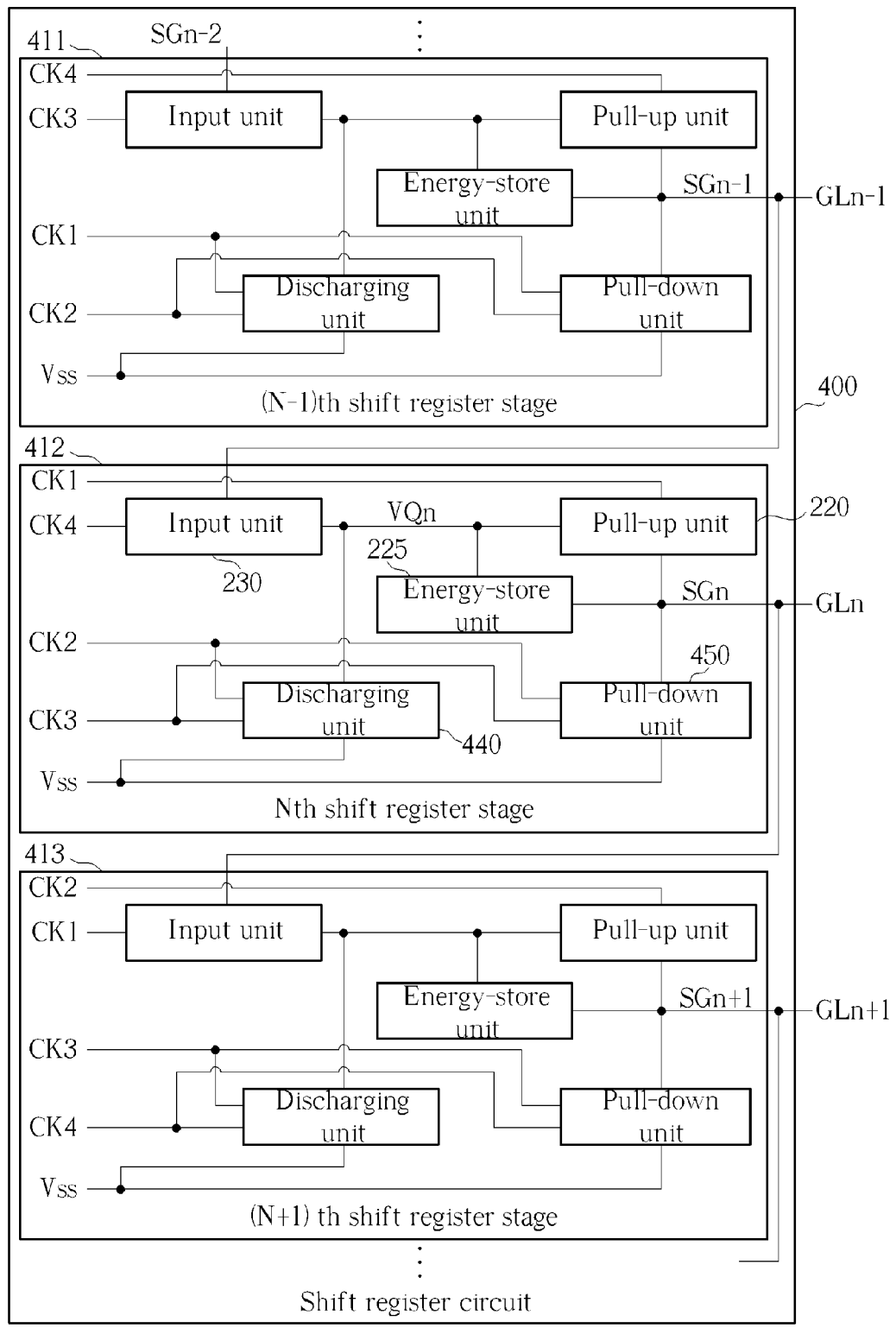
FIG. 7 is a schematic diagram showing a shift register circuit in accordance with a third embodiment of the present invention.

FIG. 7 is a schematic diagram showing a shift register circuit in accordance with a third embodiment of the present invention. As shown in FIG. 7, the shift register circuit 400 comprises a plurality of shift register stages and, for ease of explanation, illustrates an (N−1)th shift register stage 411, an Nth shift register stage 412 and an (N+1)th shift register stage 413. In the operation of the shift register circuit 400, each shift register stage provides one corresponding gate signal furnished to one corresponding gate line according to a first clock CK1, a second clock CK2, a third clock CK3 and a fourth clock CK4. For instance, the (N−1)th shift register stage 411 is employed to provide a gate signal SGn−1 furnished to a gate line GLn−1, the Nth shift register stage 412 is employed to provide a gate signal SGn furnished to a gate line GLn, and the (N+1)th shift register stage 413 is employed to provide a gate signal SGn+1 furnished to a gate line GLn+1. The structure of the Nth shift register stage 412 is similarly to that of the Nth shift register stage 212 shown in FIG. 2, differing in that the discharging unit 240 is replaced with a discharging unit 440 and the pull-down unit 250 is replaced with a pull-down unit 450. The discharging unit 440, electrically connected to the energy-store unit 225, is employed to perform an alternate pull-down operation on the driving control voltage VQn according to the second clock CK2 and the third clock CK3, for pulling down the driving control voltage VQn to a low power voltage Vss. The pull-down unit 450, electrically connected to the gate line GLn, is employed to perform an alternate pull-down operation on the gate signal SGn according to the second clock CK2 and the third clock CK3, for pulling down the gate signal SGn to the low power voltage Vss.

Figure 8:
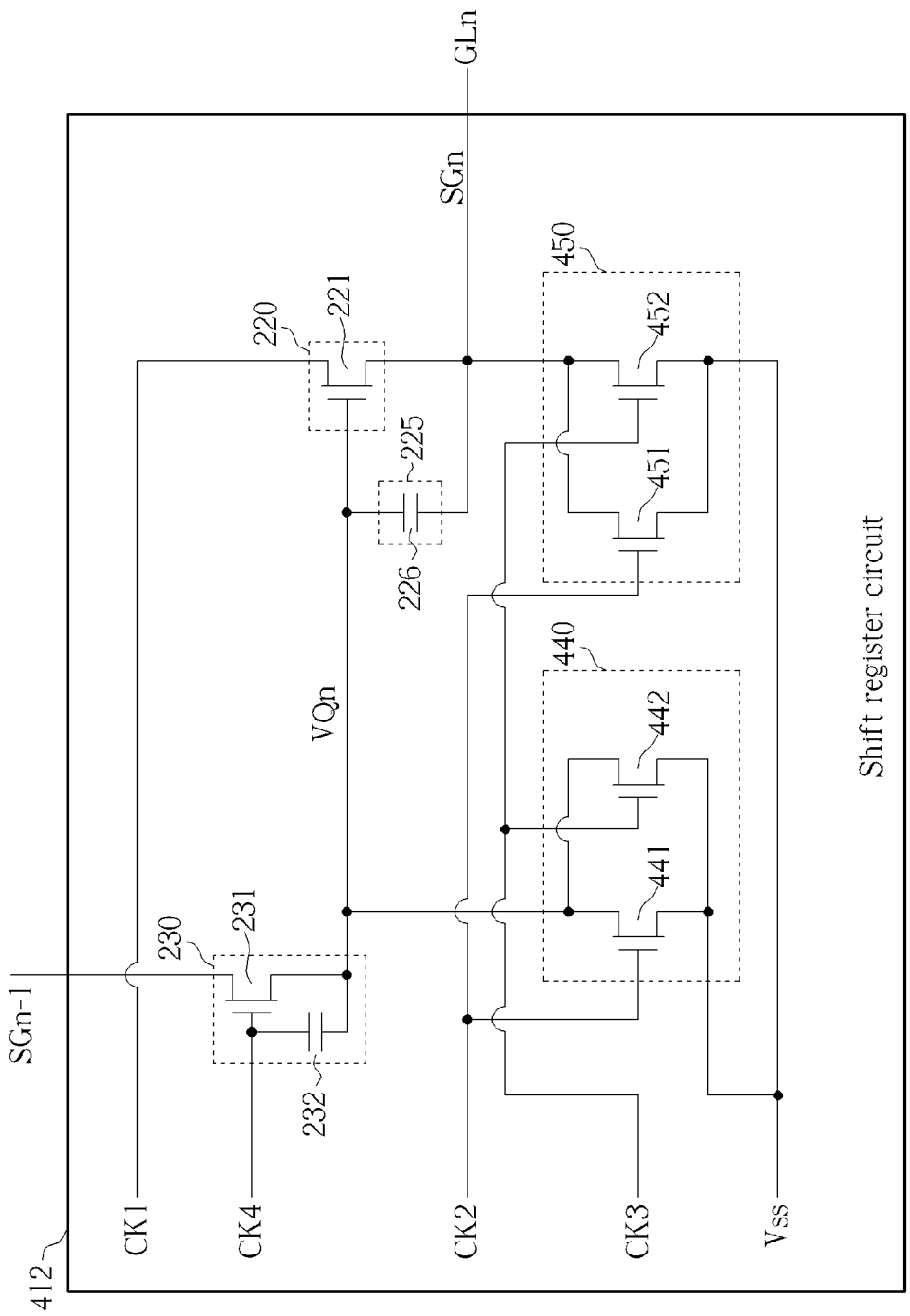
FIG. 8 is a circuit diagram illustrating the Nth shift register stage shown in FIG. 7.

FIG. 8 is a circuit diagram illustrating the Nth shift register stage shown in FIG. 7. Regarding the circuit embodiment of the Nth shift register stage 412 shown in FIG. 8, the discharging unit 440 comprises a third transistor 441 and a fourth transistor 442, and the pull-down unit 450 comprises a fifth transistor 451 and a sixth transistor 452. The third transistor 441 comprises a first end electrically connected to the second end of the second transistor 231, a gate end for receiving the second clock CK2, and a second end for receiving the low power voltage Vss. The fourth transistor 442 comprises a first end electrically connected to the second end of the second transistor 231, a gate end for receiving the third clock CK3, and a second end for receiving the low power voltage Vss. The fifth transistor 451 comprises a first end electrically connected to the gate line GLn, a gate end for receiving the second clock CK2, and a second end for receiving the low power voltage Vss. The sixth transistor 452 comprises a first end electrically connected to the gate line GLn, a gate end for receiving the third clock CK3, and a second end for receiving the low power voltage Vss.

Figure 9:
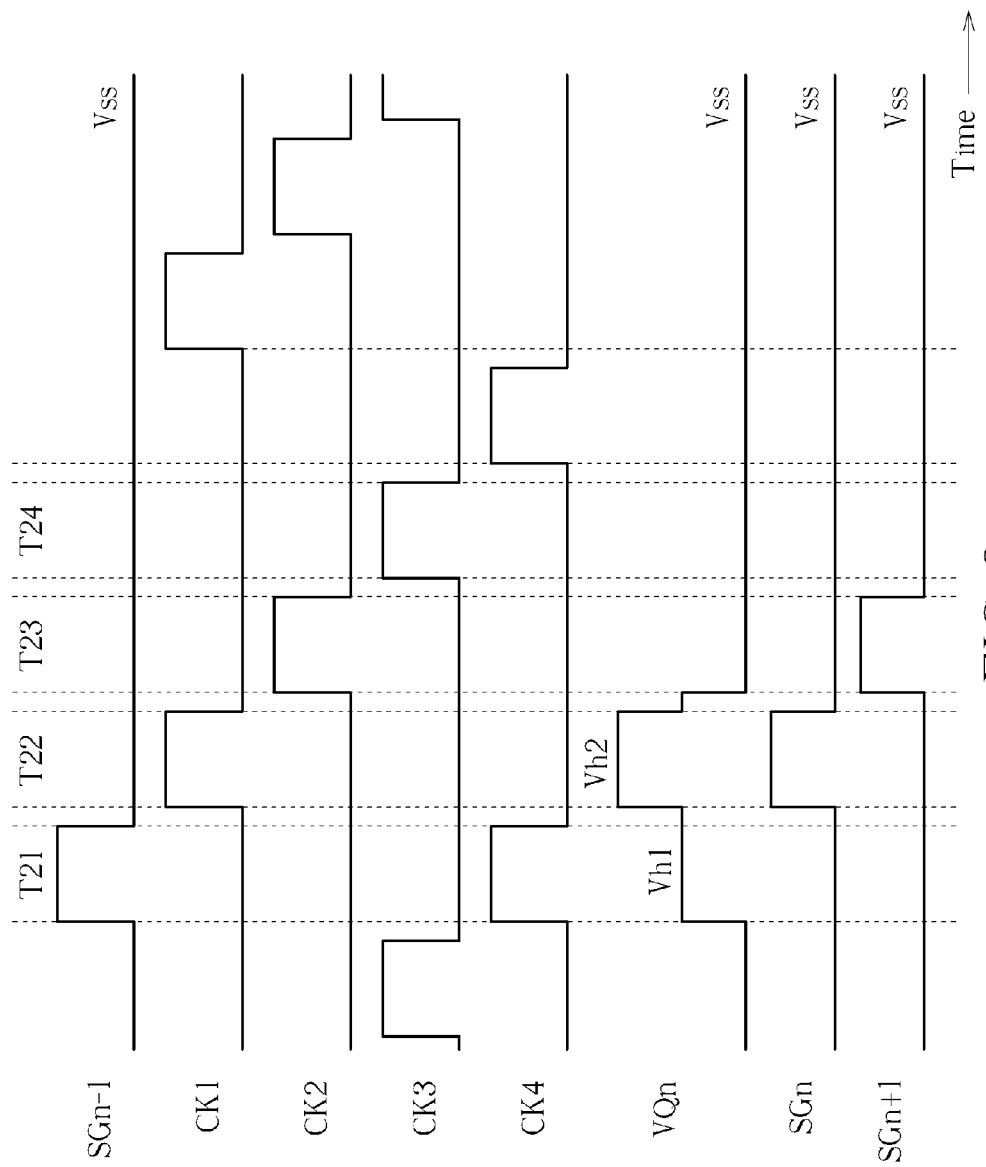
FIG. 9 is a schematic diagram showing related signal waveforms regarding the operation of the shift register circuit illustrated in FIGS. 7-8, having time along the abscissa.

FIG. 9 is a schematic diagram showing related signal waveforms regarding the operation of the shift register circuit illustrated in FIGS. 7-8, having time along the abscissa. The signal waveforms in FIG. 9, from top to bottom, are the gate signal SGn−1, the first clock CK1, the second clock CK2, the third clock CK3, the fourth clock CK4, the driving control voltage VQn, the gate signal SGn, and the gate signal SGn+1. As shown in FIG. 9, the signal waveforms during the intervals T21, T22, T23 and T24 are similar to the signal waveforms during the intervals T11, T12, T13 and T14 shown in FIG. 4, differing in that both the first low power voltage Vss1 and the second low power voltage Vss2 are replaced with the low power voltage Vss. That is, the driving control voltage VQn is pulled down to the low power voltage Vss during the intervals T23 and T24, and the gate signal SGn is also pulled down to the low power voltage Vss during the intervals T23 and T24. Except for the aforementioned difference, the other circuit operations of the shift register circuit 400 are substantially identical to corresponding circuit operations of the shift register circuit 200 and, for the sake of brevity, further similar discussion thereof is omitted.

Figure 10:
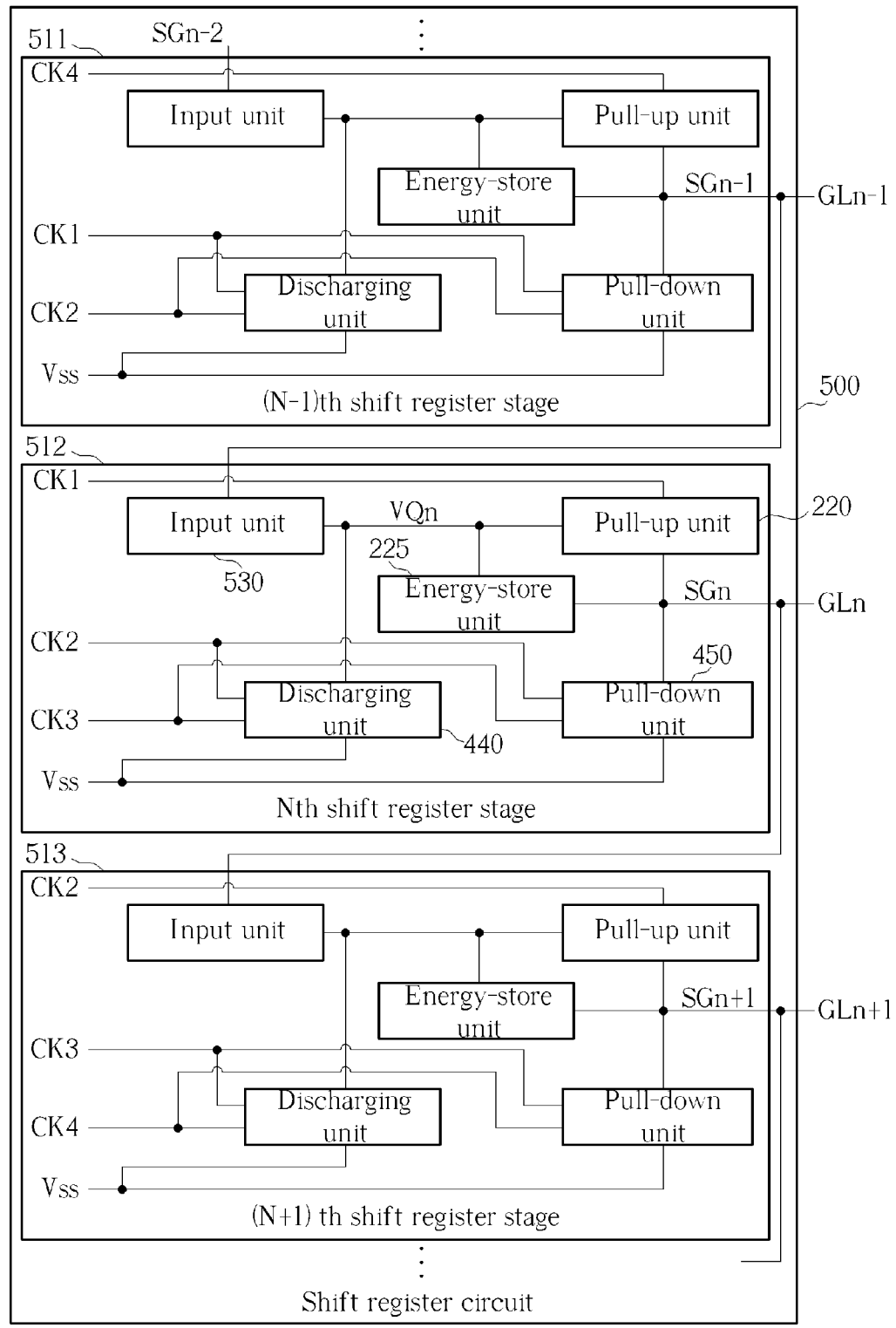
FIG. 10 is a schematic diagram showing a shift register circuit in accordance with a fourth embodiment of the present invention.

FIG. 10 is a schematic diagram showing a shift register circuit in accordance with a fourth embodiment of the present invention. As shown in FIG. 10, the shift register circuit 500 comprises a plurality of shift register stages and, for ease of explanation, illustrates an (N−1)th shift register stage 511, an Nth shift register stage 512 and an (N+1)th shift register stage 513. In the operation of the shift register circuit 500, the (N−1)th shift register stage 511 is utilized for providing a gate signal SGn−1 furnished to a gate line GLn−1 based on a first clock CK1, a second clock CK2 and a fourth clock CK4, the Nth shift register stage 512 is utilized for providing a gate signal SGn furnished to a gate line GLn based on the first clock CK1, the second clock CK2 and a third clock CK3, and the (N+1)th shift register stage 513 is utilized for providing a gate signal SGn+1 furnished to a gate line GLn+1 based on the second clock CK2, the third clock CK3 and the fourth clock CK4. The structure of the Nth shift register stage 512 is similarly to that of the Nth shift register stage 412 shown in FIG. 7, differing in that the input unit 230 is replaced with an input unit 530. The input unit 530, electrically connected to the (N−1)th shift register stage 511, is utilized for inputting the gate signal SGn−1 to become the driving control voltage VQn. It is noted that the input unit 530 is not controlled by the fourth clock CK4.

Figure 11:
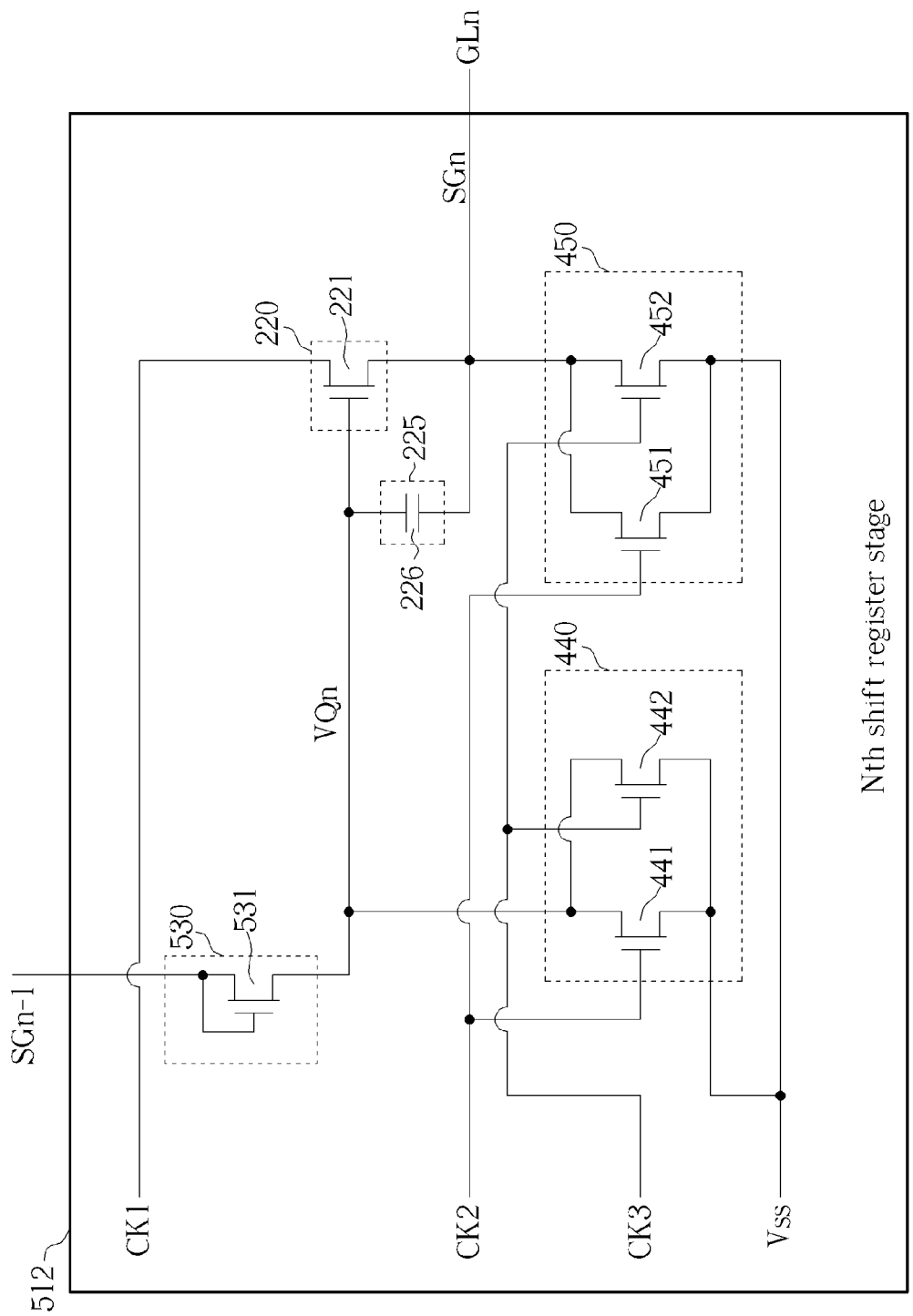
FIG. 11 is a circuit diagram illustrating the Nth shift register stage shown in FIG. 10.

FIG. 11 is a circuit diagram illustrating the Nth shift register stage shown in FIG. 10. Regarding the circuit embodiment of the Nth shift register stage 512 shown in FIG. 11, the input unit 530 comprises a second transistor 531 only, and the other units are identical to corresponding units of the Nth shift register stage 412 shown in FIG. 8. The second transistor 531 comprises a first end electrically connected to the (N−1)th shift register stage 511 for receiving the gate signal SGn−1, a gate end electrically connected to the first end, and a second end electrically connected to the energy-store unit 225 and the pull-up unit 220. Since the fourth clock CK4 is not furnished to the gate end of the second transistor 531, the ripple of the driving control voltage VQn, which is caused by the rising/falling edges of the first clock CK1 via the device capacitor of the first transistor 221, is not compensated. Accordingly, it is not required to dispose a second capacitor between the gate and second ends of the second transistor 531, for bringing the cost down. The signal waveforms regarding the operation of the shift register circuit 500 illustrated in FIGS. 10-11 are substantially identical to the signal waveforms shown in FIG. 9 and, for the sake of brevity, further similar discussion thereof is omitted.

Figure 12:
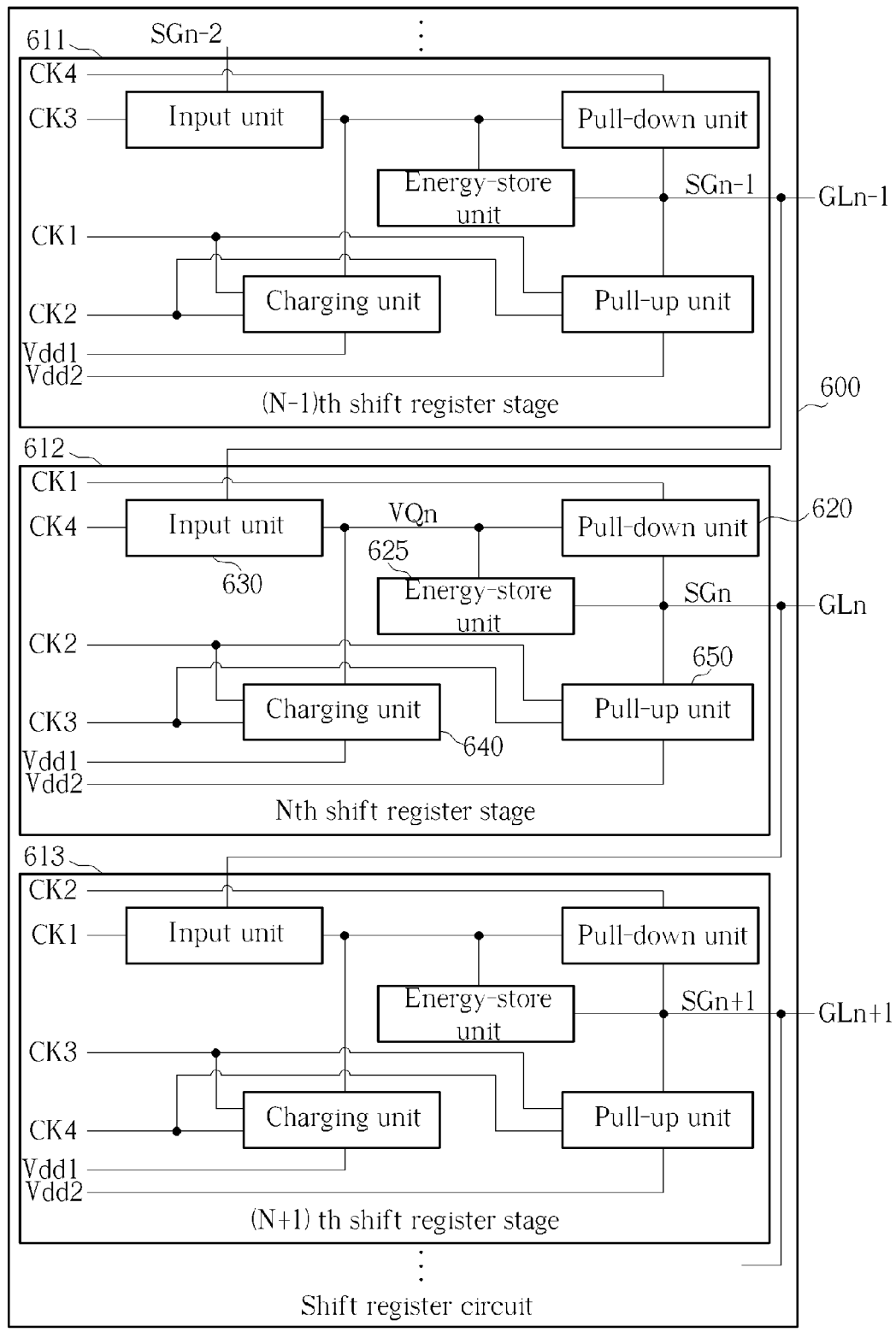
FIG. 12 is a schematic diagram showing a shift register circuit in accordance with a fifth embodiment of the present invention.

FIG. 12 is a schematic diagram showing a shift register circuit in accordance with a fifth embodiment of the present invention. As shown in FIG. 12, the shift register circuit 600 comprises a plurality of shift register stages and, for ease of explanation, illustrates an (N−1)th shift register stage 611, an Nth shift register stage 612 and an (N+1)th shift register stage 613. In the operation of the shift register circuit 600, each shift register stage provides one corresponding gate signal furnished to one corresponding gate line according to a first clock CK1, a second clock CK2, a third clock CK3 and a fourth clock CK4. For instance, the (N−1)th shift register stage 611 is employed to provide a gate signal SGn−1 furnished to a gate line GLn−1, the Nth shift register stage 612 is employed to provide a gate signal SGn furnished to a gate line GLn, and the (N+1) th shift register stage 613 is employed to provide a gate signal SGn+1 furnished to a gate line GLn+1. The internal structure of the Nth shift register stage 612 is detailed as the followings, and the other shift register stages can be inferred by analogy.

The Nth shift register stage 612 comprises a pull-down unit 620, an input unit 630, an energy-store unit 625, a charging unit 640, and a pull-up unit 650. The pull-down unit 620, electrically connected to the gate line GLn, is utilized for pulling down the gate signal SGn of the gate line GLn according to a driving control voltage VQn and the first clock CK1. The input unit 630, electrically connected to the (N−1)th shift register stage 611, is utilized for inputting the gate signal SGn−1 to become the driving control voltage VQn. That is, the gate signal SGn−1 also functions as a start pulse signal for enabling the Nth shift register stage 612. The energy-store unit 625, electrically connected to the pull-down unit 620 and the input unit 630, is put in use for storing the driving control voltage VQn. The charging unit 640, electrically connected to the energy-store unit 625, is employed to perform an alternate pull-up operation on the driving control voltage VQn according to the second clock CK2 and the third clock CK3, for pulling up the driving control voltage VQn to a first high power voltage Vdd1. The pull-up unit 650, electrically connected to the gate line GLn, is employed to perform an alternate pull-up operation on the gate signal SGn according to the second clock CK2 and the third clock CK3, for pulling up the gate signal SGn to a second high power voltage Vdd2. The second high power voltage Vdd2 is less than the first high power voltage Vdd1.

Figure 13:
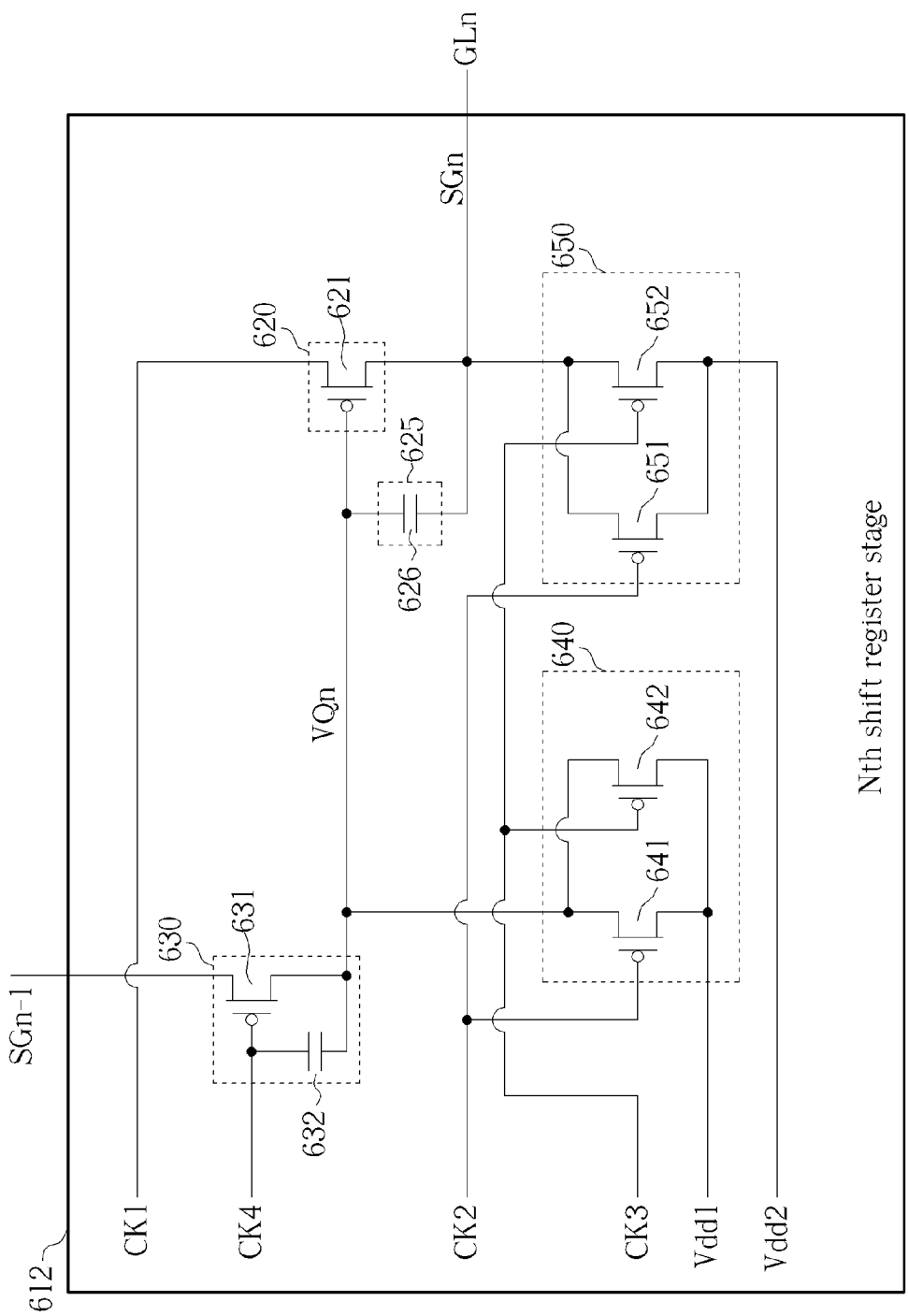
FIG. 13 is a circuit diagram illustrating the Nth shift register stage shown in FIG. 12.

FIG. 13 is a circuit diagram illustrating the Nth shift register stage shown in FIG. 12. Regarding the circuit embodiment of the Nth shift register stage 612 shown in FIG. 13, the pull-down unit 620 comprises a first transistor 621, the energy-store unit 625 comprises a first capacitor 626, the input unit 630 comprises a second transistor 631 and a second capacitor 632, the charging unit 640 comprises a third transistor 641 and a fourth transistor 642, and the pull-up unit 650 comprises a fifth transistor 651 and a sixth transistor 652. The first transistor 621 through the sixth transistor 652 are P-type thin film transistors or P-type field effect transistors.

The second transistor 631 comprises a first end electrically connected to the (N−1)th shift register stage 611 for receiving the gate signal SGn−1, a gate end for receiving the fourth clock CK4, and a second end electrically connected to the energy-store unit 625 and the pull-down unit 620. The second capacitor 632 is electrically connected between the gate and second ends of the second transistor 631. The first transistor 621 comprises a first end for receiving the first clock CK1, a gate end electrically connected to the second end of the second transistor 631, and a second end electrically connected to the gate line GLn. The first capacitor 626 is electrically connected between the gate and second ends of the first transistor 621. The third transistor 641 comprises a first end electrically connected to the second end of the second transistor 631, a gate end for receiving the second clock CK2, and a second end for receiving the first high power voltage Vdd1. The fourth transistor 642 comprises a first end electrically connected to the second end of the second transistor 631, a gate end for receiving the third clock CK3, and a second end for receiving the first high power voltage Vdd1. The fifth transistor 651 comprises a first end electrically connected to the gate line GLn, a gate end for receiving the second clock CK2, and a second end for receiving the second high power voltage Vdd2. The sixth transistor 652 comprises a first end electrically connected to the gate line GLn, a gate end for receiving the third clock CK3, and a second end for receiving the second high power voltage Vdd2.

With the above in mind, it is obvious that the Nth shift register stage 612 is capable of employing the second clock CK2 and the third clock CK3 to alternately pull up the driving control voltage VQn and the gate signal SGn, and the control unit used in the prior art can be omitted accordingly, for reducing power consumption and lowering working temperature. For that reason, the reliability and life-time of the shift register circuit 600 can be enhanced. Since the third transistor 641 and the fourth transistor 642 are alternately turned on based on the second clock CK2 and the third clock CK3 respectively, the long-term high voltage stress on the third transistor 641 and the fourth transistor 642 is thus avoided for preventing an occurrence of threshold voltage shift. Correspondingly, since the fifth transistor 651 and the sixth transistor 652 are alternately turned on based on the second clock CK2 and the third clock CK3 respectively, the long-term high voltage stress on the fifth transistor 651 and the sixth transistor 652 is also avoided for preventing an occurrence of threshold voltage shift.

Figure 14:
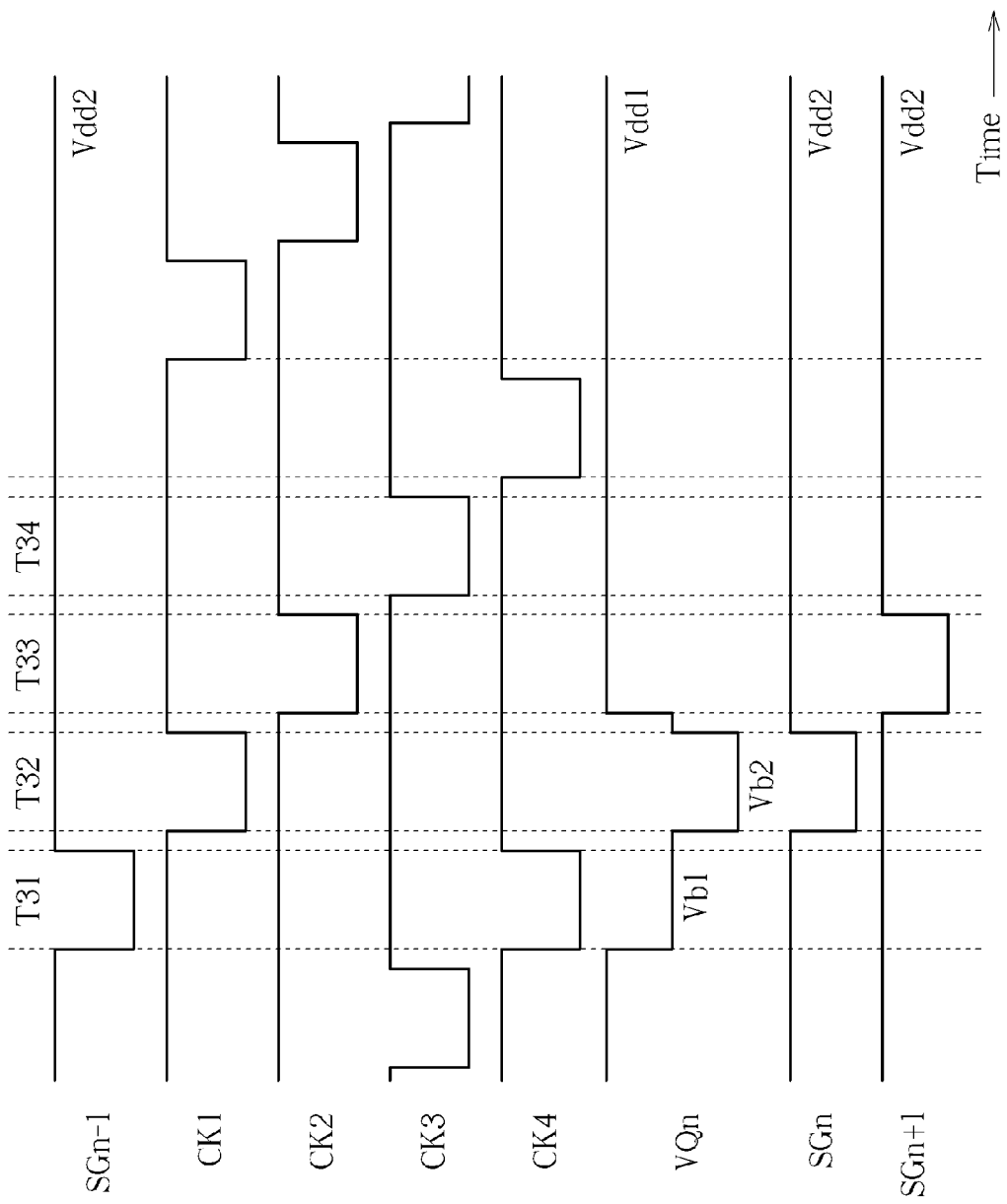
FIG. 14 is a schematic diagram showing related signal waveforms regarding the operation of the shift register circuit illustrated in FIGS. 12-13, having time along the abscissa.

FIG. 14 is a schematic diagram showing related signal waveforms regarding the operation of the shift register circuit illustrated in FIGS. 12-13, having time along the abscissa. The signal waveforms in FIG. 14, from top to bottom, are the gate signal SGn−1, the first clock CK1, the second clock CK2, the third clock CK3, the fourth clock CK4, the driving control voltage VQn, the gate signal SGn, and the gate signal SGn+1. It is noted that the pulse falling edges of the first through fourth clocks CK1-CK4 are sequentially staggered. In one preferred embodiment, the low-level pulses of the first through fourth clocks CK1-CK4 are not overlapped to each other.

As shown in FIG. 14, during an interval T31, both the gate signal SGn−1 and the fourth clock CK4 is shifting from high-level voltage to low-level voltage, the second transistor 631 is then turned on for lowering the driving control voltage VQn from high-level voltage to a first low voltage Vb1. During an interval T32, since the fourth clock CK4 is raised and holds high-level voltage, the second transistor 631 is turned off and the driving control voltage VQn therefore becomes a floating voltage. Concurrently, along with the switching of the first clock CK1 from high-level voltage to low-level voltage, the driving control voltage VQn is further lowered from the first low voltage Vb1 to a second low voltage Vb2 due to a capacitive coupling effect caused by the device capacitor of the first transistor 621. Accordingly, the first transistor 621 is turned on for pulling down the gate signal SGn from high-level voltage to low-level voltage.

During an interval T33, since the second clock CK2 is shifting down to low-level voltage, the third transistor 641 is turned on for pulling up the driving control voltage VQn to the first high power voltage Vdd1, and the fifth transistor 651 is turned on for pulling up the gate signal SGn to the second high power voltage Vdd2. Besides, by making use of the gate signal SGn as a start pulse signal, the (N+1)th shift register stage 613 is enabled to generate the gate signal SGn+1 having low-level voltage during the interval T33. During an interval T34, since the third clock CK3 is shifting down to low-level voltage, the fourth transistor 642 is turned on for pulling up the driving control voltage VQn to the first high power voltage Vdd1, and the sixth transistor 652 is turned on for pulling up the gate signal SGn to the second high power voltage Vdd2.

Thereafter, as long as the gate signal SGn continues holding high-level voltage, the Nth shift register stage 612 periodically repeats the aforementioned circuit operations during the intervals T33 and T34. That is, the third transistor 641 and the fourth transistor 642 are employed to alternately pull up the driving control voltage VQn to the first high power voltage Vdd1 periodically, and the fifth transistor 651 and the sixth transistor 652 are employed to alternately pull up the gate signal SGn to the second high power voltage Vdd2 periodically. And therefore the long-term high voltage stress on any transistor used for pull-up operation is avoided for preventing an occurrence of threshold voltage shift. Besides, since the second high power voltage Vdd2 is less than the first high power voltage Vdd1, the first transistor 621 can be turned off completely so as to prevent current leakage for enhancing display quality when the gate signal SGn continues holding high-level voltage. Further, since the first transistor 621 is employed to pull down the gate signal SGn while the second transistor 631 is employed merely to input the gate signal SGn−1, the device size of the first transistor 621 is generally designed to be significantly greater than the device size of the second transistor 631, i.e. the device capacitor of the first transistor 621 is also significantly greater than the device capacitor of the second transistor 631. For that reason, the second capacitor 632 is added to compensate the device-capacitor difference between the second transistor 631 and the first transistor 621. Accordingly, with the aid of the coupling effect regarding both the second capacitor 632 and the device capacitor of the second transistor 631, the falling/rising edges of the fourth clock CK4 is then able to compensate the ripple of the driving control voltage VQn which is caused by the rising/falling edges of the first clock CK1 via the device capacitor of the first transistor 621.

Figure 15:
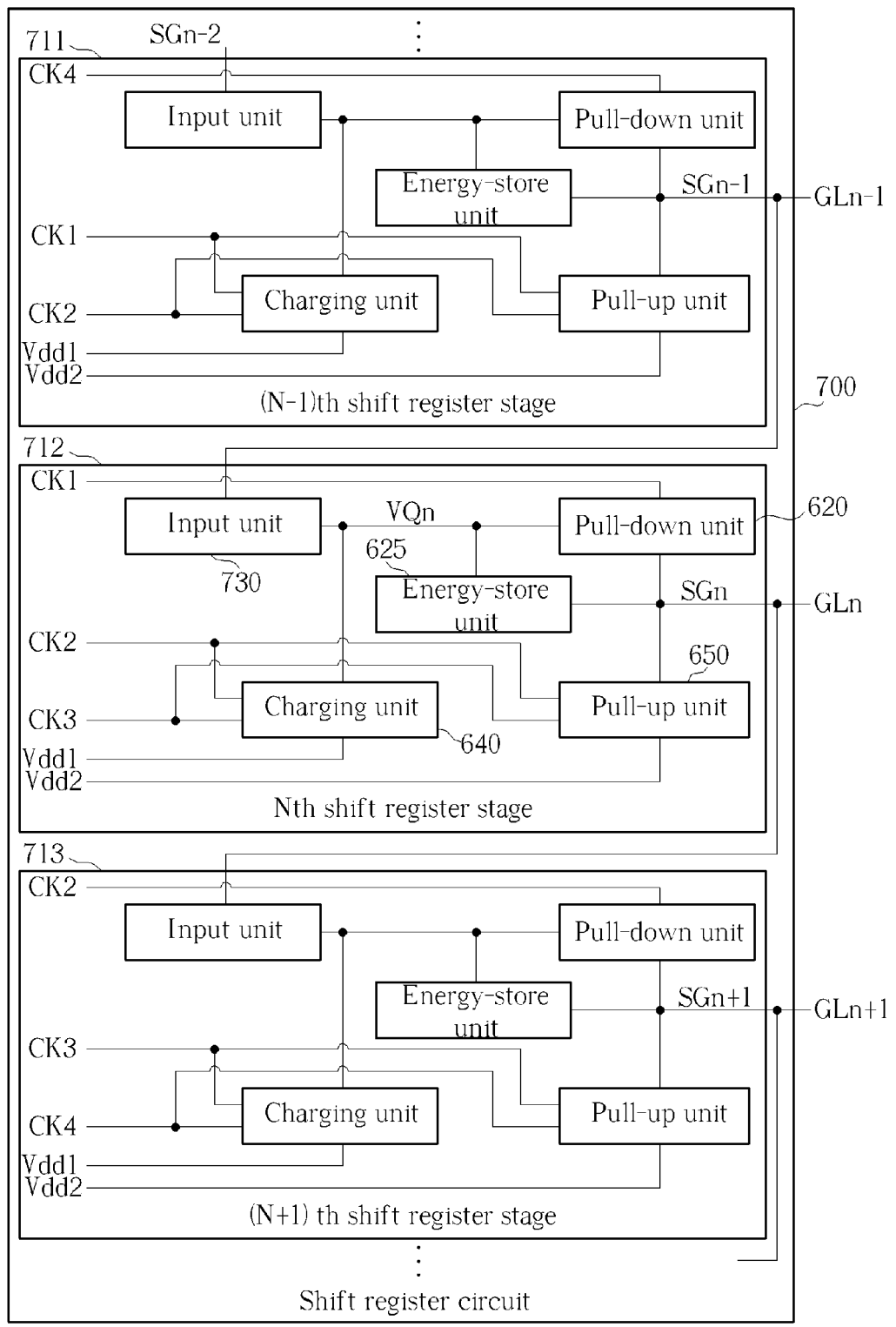
FIG. 15 is a schematic diagram showing a shift register circuit in accordance with a sixth embodiment of the present invention.

FIG. 15 is a schematic diagram showing a shift register circuit in accordance with a sixth embodiment of the present invention. As shown in FIG. 15, the shift register circuit 700 comprises a plurality of shift register stages and, for ease of explanation, illustrates an (N−1)th shift register stage 711, an Nth shift register stage 712 and an (N+1)th shift register stage 713. In the operation of the shift register circuit 700, the (N−1)th shift register stage 711 is utilized for providing a gate signal SGn−1 furnished to a gate line GLn−1 based on a first clock CK1, a second clock CK2 and a fourth clock CK4, the Nth shift register stage 712 is utilized for providing a gate signal SGn furnished to a gate line GLn based on the first clock CK1, the second clock CK2 and a third clock CK3, and the (N+1)th shift register stage 713 is utilized for providing a gate signal SGn+1 furnished to a gate line GLn+1 based on the second clock CK2, the third clock CK3 and the fourth clock CK4. The structure of the Nth shift register stage 712 is similarly to that of the Nth shift register stage 612 shown in FIG. 12, differing in that the input unit 630 is replaced with an input unit 730. The input unit 730, electrically connected to the (N−1)th shift register stage 711, is utilized for inputting the gate signal SGn−1 to become the driving control voltage VQn. It is noted that the input unit 730 is not controlled by the fourth clock CK4.

Figure 16:
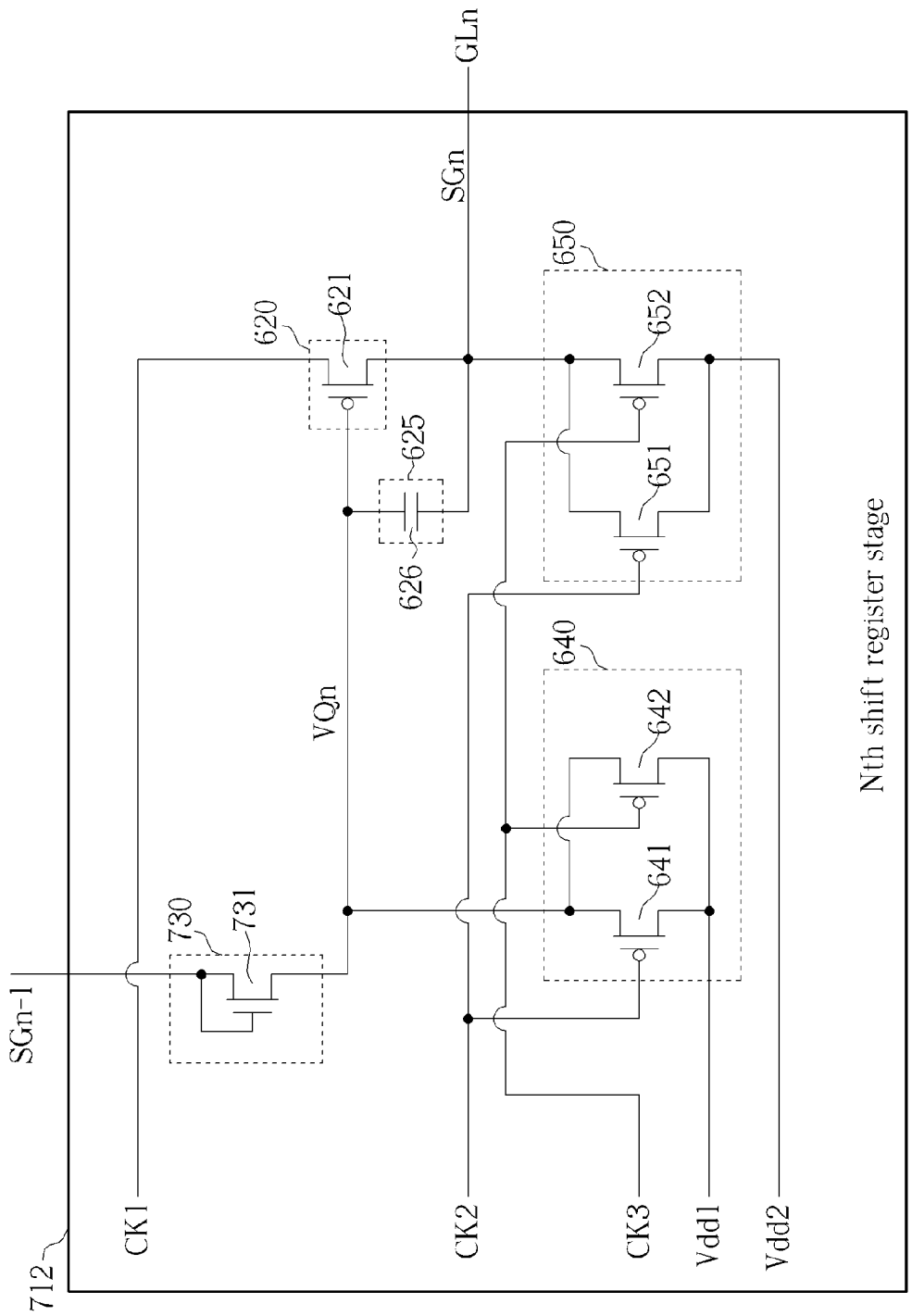
FIG. 16 is a circuit diagram illustrating the Nth shift register stage shown in FIG. 15.

FIG. 16 is a circuit diagram illustrating the Nth shift register stage shown in FIG. 15. Regarding the circuit embodiment of the Nth shift register stage 712 shown in FIG. 16, the input unit 730 comprises a second transistor 731 only, and the other units are identical to corresponding units of the Nth shift register stage 612 shown in FIG. 13. The second transistor 731 comprises a first end electrically connected to the (N−1) th shift register stage 711 for receiving the gate signal SGn−1, a gate end electrically connected to the first end, and a second end electrically connected to the energy-store unit 625 and the pull-down unit 620. Since the fourth clock CK4 is not furnished to the gate end of the second transistor 731, the ripple of the driving control voltage VQn, which is caused by the rising/falling edges of the first clock CK1 via the device capacitor of the first transistor 621, is not compensated. Accordingly, it is not required to dispose a second capacitor between the gate and second ends of the second transistor 731, for bringing the cost down. The signal waveforms regarding the operation of the shift register circuit 700 illustrated in FIGS. 15-16 are substantially identical to the signal waveforms shown in FIG. 14 and, for the sake of brevity, further similar discussion thereof is omitted.

Figure 17:
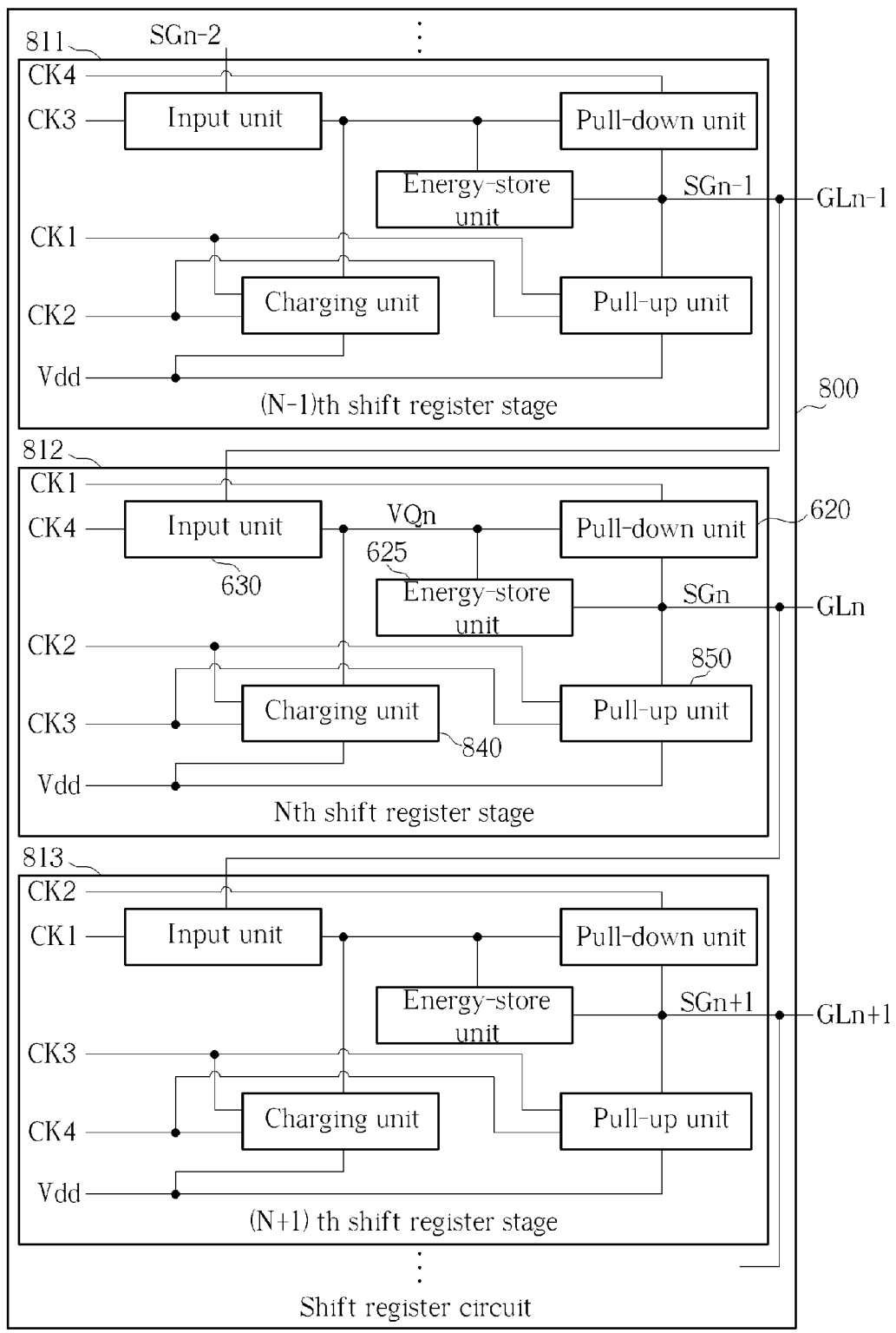
FIG. 17 is a schematic diagram showing a shift register circuit in accordance with a seventh embodiment of the present invention.

FIG. 17 is a schematic diagram showing a shift register circuit in accordance with a seventh embodiment of the present invention. As shown in FIG. 17, the shift register circuit 800 comprises a plurality of shift register stages and, for ease of explanation, illustrates an (N−1)th shift register stage 811, an Nth shift register stage 812 and an (N+1)th shift register stage 813. In the operation of the shift register circuit 800, each shift register stage provides one corresponding gate signal furnished to one corresponding gate line according to a first clock CK1, a second clock CK2, a third clock CK3 and a fourth clock CK4. For instance, the (N−1)th shift register stage 811 is employed to provide a gate signal SGn−1 furnished to a gate line GLn−1, the Nth shift register stage 812 is employed to provide a gate signal SGn furnished to a gate line GLn, and the (N+1) th shift register stage 813 is employed to provide a gate signal SGn+1 furnished to a gate line GLn+1. The structure of the Nth shift register stage 812 is similarly to that of the Nth shift register stage 612 shown in FIG. 12, differing in that the charging unit 640 is replaced with a charging unit 840 and the pull-up unit 650 is replaced with a pull-up unit 850. The charging unit 840, electrically connected to the energy-store unit 625, is employed to perform an alternate pull-up operation on the driving control voltage VQn according to the second clock CK2 and the third clock CK3, for pulling up the driving control voltage VQn to a high power voltage Vdd. The pull-up unit 850, electrically connected to the gate line GLn, is employed to perform an alternate pull-up operation on the gate signal SGn according to the second clock CK2 and the third clock CK3, for pulling up the gate signal SGn to the high power voltage Vdd.

Figure 18:
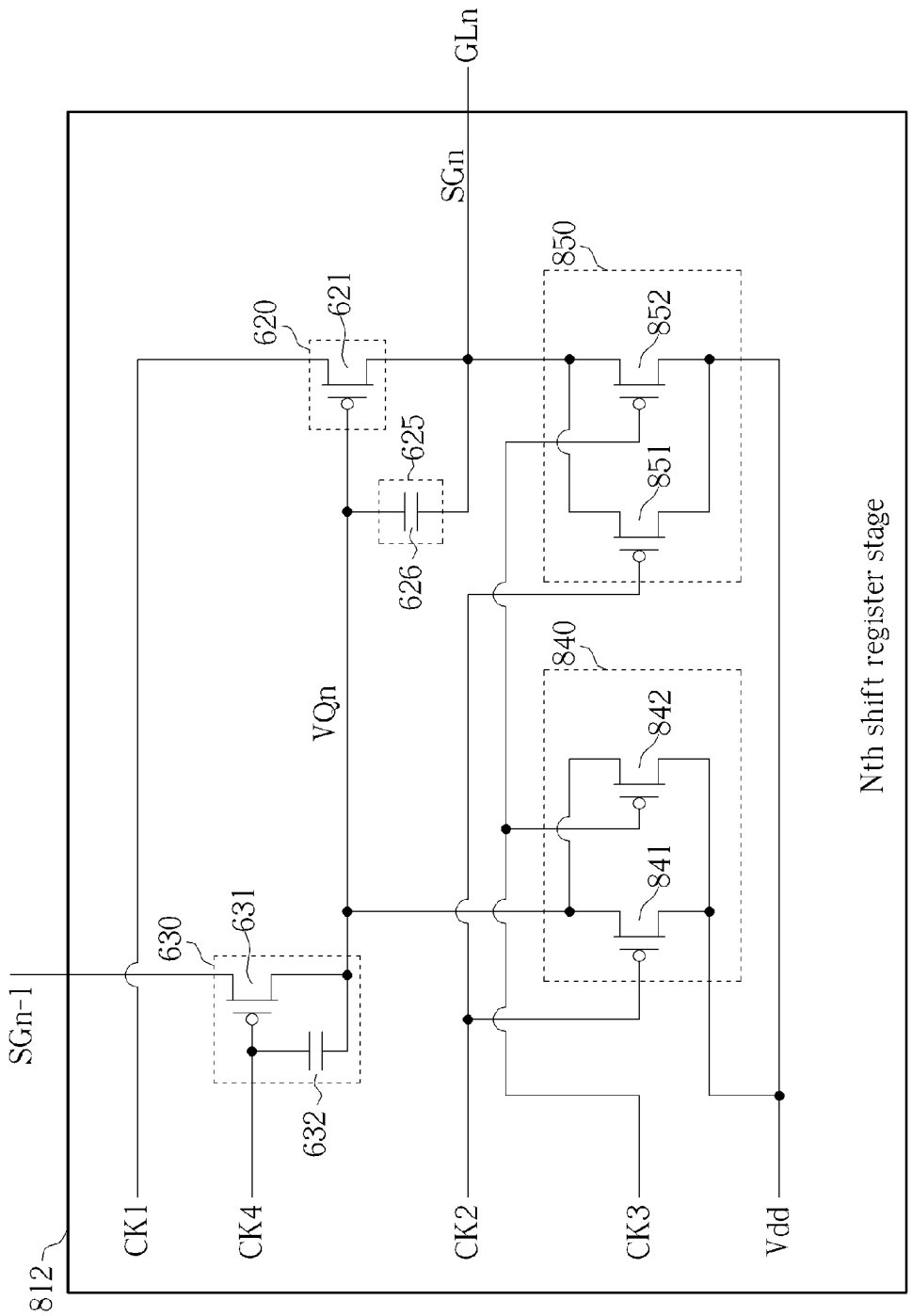
FIG. 18 is a circuit diagram illustrating the Nth shift register stage shown in FIG. 17.

FIG. 18 is a circuit diagram illustrating the Nth shift register stage shown in FIG. 17. Regarding the circuit embodiment of the Nth shift register stage 812 shown in FIG. 18, the charging unit 840 comprises a third transistor 841 and a fourth transistor 842, and the pull-up unit 850 comprises a fifth transistor 851 and a sixth transistor 852. The third transistor 841 comprises a first end electrically connected to the second end of the second transistor 631, a gate end for receiving the second clock CK2, and a second end for receiving the high power voltage Vdd. The fourth transistor 842 comprises a first end electrically connected to the second end of the second transistor 631, a gate end for receiving the third clock CK3, and a second end for receiving the high power voltage Vdd. The fifth transistor 851 comprises a first end electrically connected to the gate line GLn, a gate end for receiving the second clock CK2, and a second end for receiving the high power voltage Vdd. The sixth transistor 852 comprises a first end electrically connected to the gate line GLn, a gate end for receiving the third clock CK3, and a second end for receiving the high power voltage Vdd.

Figure 19:
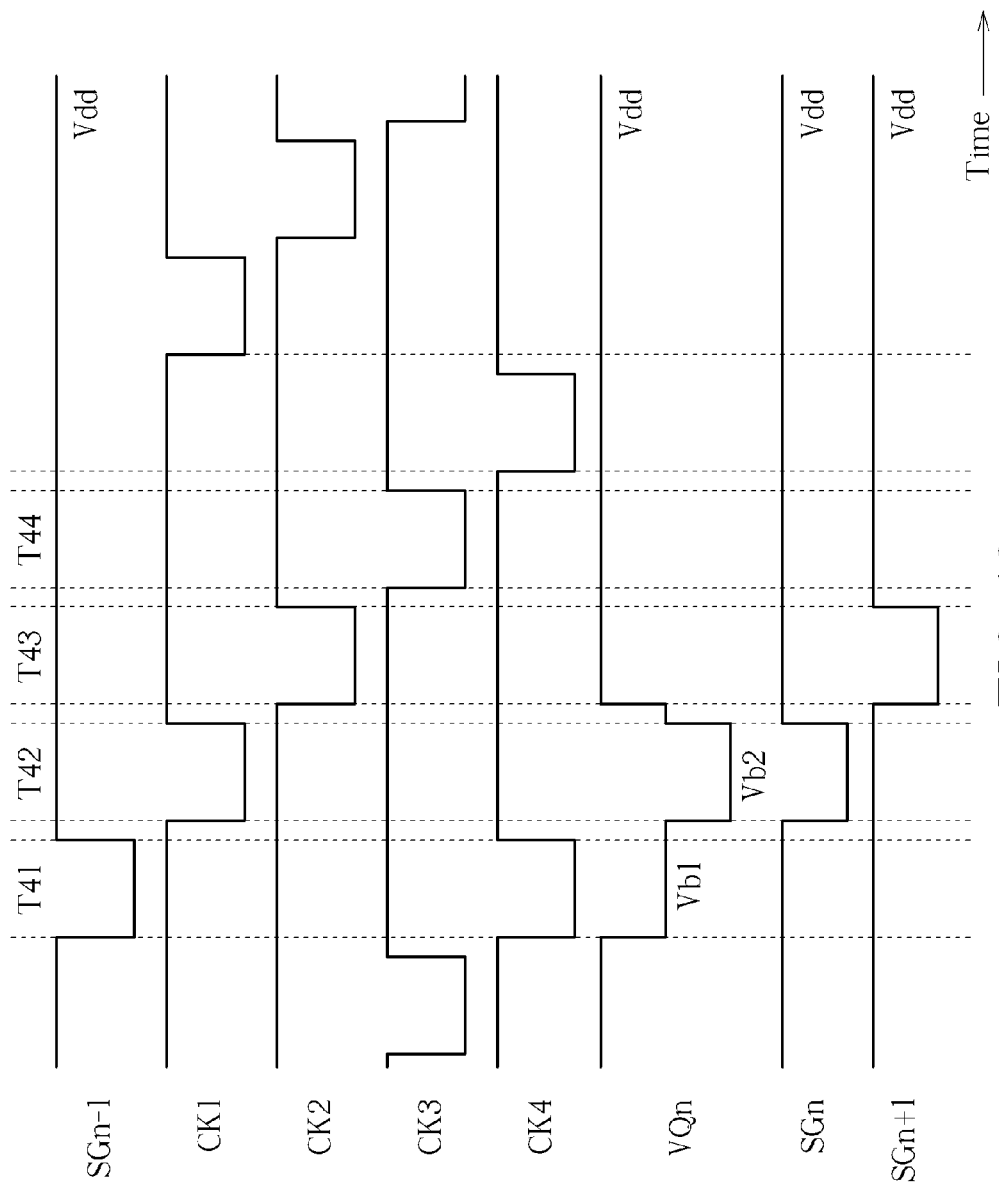
FIG. 19 is a schematic diagram showing related signal waveforms regarding the operation of the shift register circuit illustrated in FIGS. 17-18, having time along the abscissa.

FIG. 19 is a schematic diagram showing related signal waveforms regarding the operation of the shift register circuit illustrated in FIGS. 17-18, having time along the abscissa. The signal waveforms in FIG. 19, from top to bottom, are the gate signal SGn−1, the first clock CK1, the second clock CK2, the third clock CK3, the fourth clock CK4, the driving control voltage VQn, the gate signal SGn, and the gate signal SGn+1. As shown in FIG. 19, the signal waveforms during the intervals T41, T42, T43 and T44 are similar to the signal waveforms during the intervals T31, T32, T33 and T34 shown in FIG. 14, differing in that both the first high power voltage Vdd1 and the second high power voltage Vdd2 are replaced with the high power voltage Vdd. That is, the driving control voltage VQn is pulled up to the high power voltage Vdd during the intervals T43 and T44, and the gate signal SGn is also pulled up to the high power voltage Vdd during the intervals T43 and T44. Except for the aforementioned difference, the other circuit operations of the shift register circuit 800 are substantially identical to corresponding circuit operations of the shift register circuit 600 and, for the sake of brevity, further similar discussion thereof is omitted.

Figure 20:
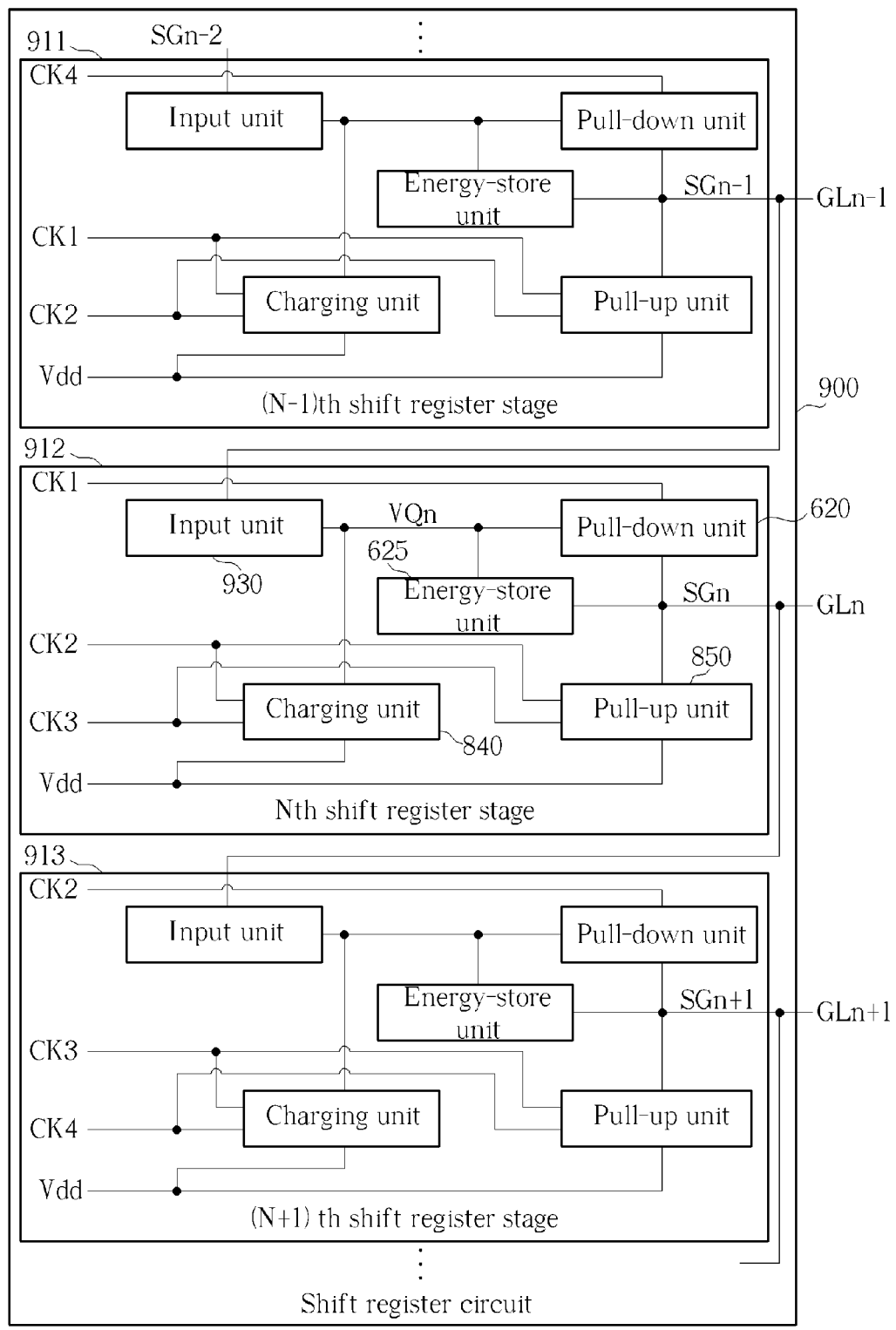
FIG. 20 is a schematic diagram showing a shift register circuit in accordance with an eighth embodiment of the present invention.

FIG. 20 is a schematic diagram showing a shift register circuit in accordance with an eighth embodiment of the present invention. As shown in FIG. 20, the shift register circuit 900 comprises a plurality of shift register stages and, for ease of explanation, illustrates an (N−1)th shift register stage 911, an Nth shift register stage 912 and an (N+1)th shift register stage 913. In the operation of the shift register circuit 900, the (N−1)th shift register stage 911 is utilized for providing a gate signal SGn−1 furnished to a gate line GLn−1 based on a first clock CK1, a second clock CK2 and a fourth clock CK4, the Nth shift register stage 912 is utilized for providing a gate signal SGn furnished to a gate line GLn based on the first clock CK1, the second clock CK2 and a third clock CK3, and the (N+1)th shift register stage 913 is utilized for providing a gate signal SGn+1 furnished to a gate line GLn+1 based on the second clock CK2, the third clock CK3 and the fourth clock CK4. The structure of the Nth shift register stage 912 is similarly to that of the Nth shift register stage 812 shown in FIG. 17, differing in that the input unit 630 is replaced with an input unit 930. The input unit 930, electrically connected to the (N−1)th shift register stage 911, is utilized for inputting the gate signal SGn−1 to become the driving control voltage VQn. It is noted that the input unit 930 is not controlled by the fourth clock CK4.

Figure 21:
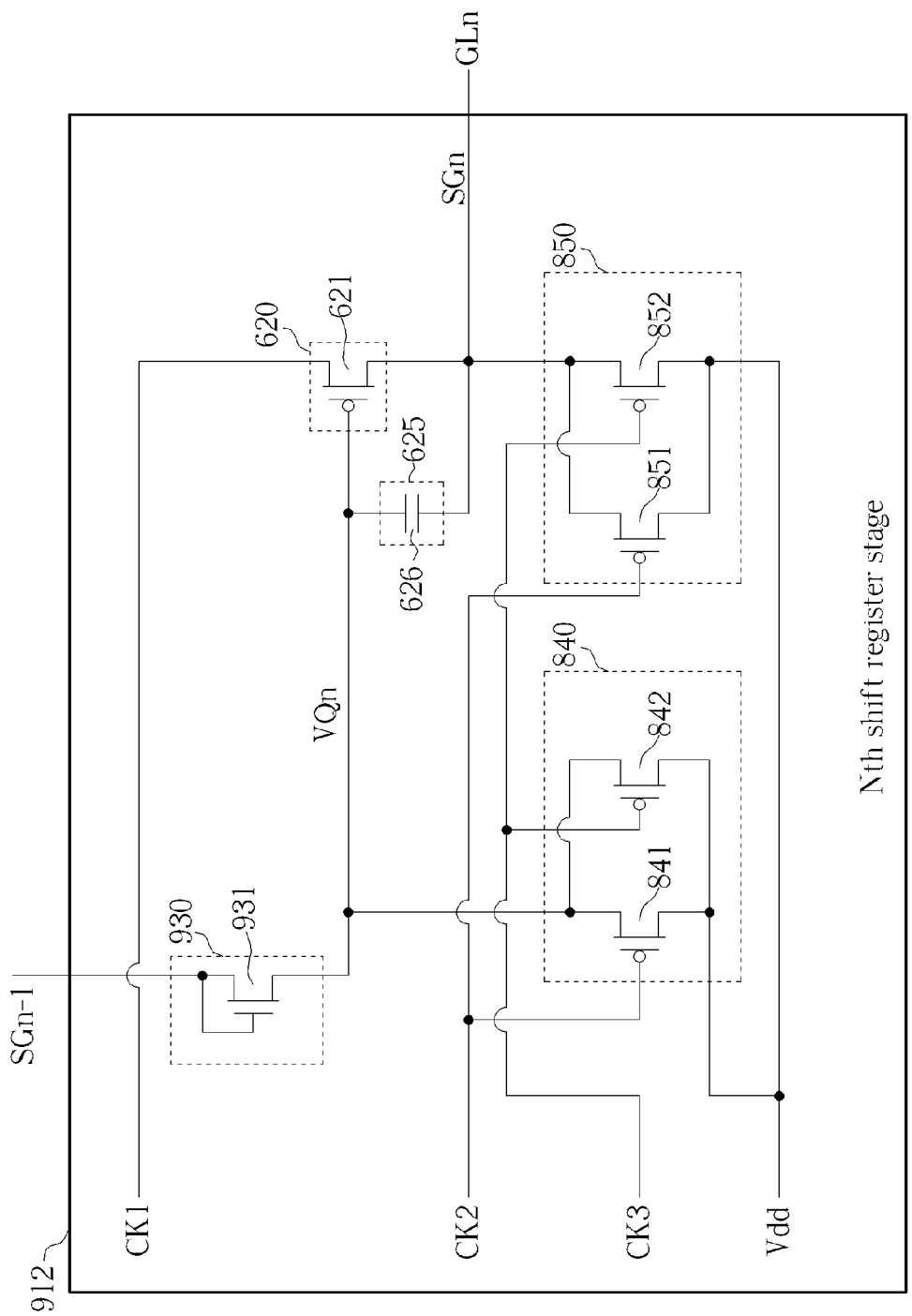
FIG. 21 is a circuit diagram illustrating the Nth shift register stage shown in FIG. 20.

FIG. 21 is a circuit diagram illustrating the Nth shift register stage shown in FIG. 20. Regarding the circuit embodiment of the Nth shift register stage 912 shown in FIG. 21, the input unit 930 comprises a second transistor 931 only, and the other units are identical to corresponding units of the Nth shift register stage 812 shown in FIG. 18. The second transistor 931 comprises a first end electrically connected to the (N−1)th shift register stage 911 for receiving the gate signal SGn−1, a gate end electrically connected to the first end, and a second end electrically connected to the energy-store unit 625 and the pull-down unit 620. Since the fourth clock CK4 is not furnished to the gate end of the second transistor 931, the ripple of the driving control voltage VQn, which is caused by the rising/falling edges of the first clock CK1 via the device capacitor of the first transistor 621, is not compensated. Accordingly, it is not required to dispose a second capacitor between the gate and second ends of the second transistor 931, for bringing the cost down. The signal waveforms regarding the operation of the shift register circuit 900 illustrated in FIGS. 20-21 are substantially identical to the signal waveforms shown in FIG. 19 and, for the sake of brevity, further similar discussion thereof is omitted.

Although the shift register circuit disclosed in the aforementioned eight embodiments provides plural gate signals according to four clocks, the circuit design according to the present invention can be easily extended to implement a shift register circuit based on more clocks for providing plural gate signals. For instance, the discharging/charging unit and the pull-down/pull-up unit may employ three or more clocks to perform corresponding alternate pull-down/pull-up operations. In conclusion, the shift register circuit of the present invention employs at least four clocks to provide plural gate signals, for reducing power consumption by omitting a control unit, and for enhancing the reliability and life-time of the shift register circuit by preventing an occurrence of threshold voltage shift which is caused by the long-term high voltage stress on the transistors used for corresponding pull-down/pull-up operations.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A shift register circuit for providing plural gate signals to plural gate lines, the shift register circuit comprising a plurality of shift register stages, an Nth shift register stage of the shift register stages comprising:

a pull-up unit, electrically connected to an Nth gate line of the gate lines, for pulling up an Nth gate signal of the gate signals according to a driving control voltage and a first clock;

an input unit for inputting an (N−1)th gate signal generated by an (N−1)th shift register stage of the shift register stages to become the driving control voltage, wherein the input unit comprises a transistor having a first end electrically connected to the (N−1)th shift register stage for receiving the (N−1)th gate signal, a gate end for receiving a fourth clock, and a second end electrically connected to the pull-up unit;

an energy-store unit, electrically connected to the pull-up unit and the second end of the transistor, for storing the driving control voltage;

a discharging unit, electrically connected to the energy-store unit, for performing an alternate pull-down operation on the driving control voltage according to a second clock and a third clock; and a pull-down unit, electrically connected to the Nth gate line, for performing an alternate pull-down operation on the Nth gate signal according to the second clock and the third clock;

wherein a high-level pulse of the first clock, a high-level pulse of the second clock, a high-level pulse of the third clock and a high-level pulse of the fourth clock are not overlapped to each other.

2. The shift register circuit of claim 1, wherein the energy-store unit comprises:
a capacitor electrically connected between the input unit and the Nth gate line.

3. The shift register circuit of claim 1, wherein the pull-up unit comprises a transistor, the transistor comprising:
a first end for receiving the first clock;
a gate end, electrically connected to the input unit, for receiving the driving control voltage; and
a second end electrically connected to the Nth gate line;
wherein the transistor is an N-type thin film transistor or an N-type field effect transistor.

4. The shift register circuit of claim 1,
wherein the transistor is an N-type thin film transistor or an N-type field effect transistor.

5. The shift register circuit of claim 1, wherein the input unit further comprises:
a capacitor electrically connected between the gate and second ends of the transistor.

6. The shift register circuit of claim 1, wherein:
the discharging unit comprises:
a first transistor comprising:
a first end electrically connected to the energy-store unit;
a gate end for receiving the second clock; and
a second end for receiving a first low power voltage; and
a second transistor comprising:
a first end electrically connected to the first end of the first transistor;
a gate end for receiving the third clock; and
a second end for receiving the first low power voltage; and
the pull-down unit comprises:
a third transistor comprising:
a first end electrically connected to the Nth gate line;
a gate end for receiving the second clock; and
a second end for receiving a second low power voltage greater than the first low power voltage; and
a fourth transistor comprising:
a first end electrically connected to the first end of the third transistor;
a gate end for receiving the third clock; and
a second end for receiving the second low power voltage;
wherein the first transistor, the second transistor, the third transistor and the fourth transistor are N-type thin film transistors or N-type field effect transistors.

7. The shift register circuit of claim 1, wherein:
the discharging unit comprises:
a first transistor comprising:
a first end electrically connected to the energy-store unit;
a gate end for receiving the second clock; and
a second end for receiving a low power voltage; and
a second transistor comprising:
a first end electrically connected to the first end of the first transistor;
a gate end for receiving the third clock; and
a second end for receiving the low power voltage; and
the pull-down unit comprises:
a third transistor comprising:
a first end electrically connected to the Nth gate line;
a gate end for receiving the second clock; and
a second end for receiving the low power voltage; and
a fourth transistor comprising:
a first end electrically connected to the first end of the third transistor;
a gate end for receiving the third clock; and
a second end for receiving the low power voltage;
wherein the first transistor, the second transistor, the third transistor and the fourth transistor are N-type thin film transistors or N-type field effect transistors.

8. A shift register circuit for providing plural gate signals to plural gate lines, the shift register circuit comprising a plurality of shift register stages, an Nth shift register stage of the shift register stages comprising:
a pull-down unit, electrically connected to an Nth gate line of the gate lines, for pulling down an Nth gate signal of the gate signals according to a driving control voltage and a first clock;
an input unit, for inputting an (N−1)th gate signal generated by an (N−1)th shift register stage of the shift register stages to become the driving control voltage, wherein the input unit comprises a transistor having a first end electrically connected to the (N−1)th shift register stage for receiving the (N−1)th gate signal, a gate end for receiving a fourth clock, and a second end electrically connected to the pull-down unit;
an energy-store unit, electrically connected to the pull-down unit and the second end of the transistor, for storing the driving control voltage;
a charging unit, electrically connected to the energy-store unit, for performing an alternate pull-up operation on the driving control voltage according to a second clock and a third clock; and
a pull-up unit, electrically connected to the Nth gate line, for performing an alternate pull-up operation on the Nth gate signal according to the second clock and the third clock;
wherein a low-level pulse of the first clock, a low-level pulse of the second clock, a low-level pulse of the third clock and a low-level pulse of the fourth clock are not overlapped to each other.

9. The shift register circuit of claim 8, wherein the energy-store unit comprises:
a capacitor electrically connected between the input unit and the Nth gate line.

10. The shift register circuit of claim 8, wherein the pull-down unit comprises a transistor, the transistor comprising:
a first end for receiving the first clock;
a gate end, electrically connected to the input unit, for receiving the driving control voltage; and
a second end electrically connected to the Nth gate line;
wherein the transistor is a P-type thin film transistor or a P-type field effect transistor.

11. The shift register circuit of claim 8,
wherein the transistor is a P-type thin film transistor or a P-type field effect transistor.

12. The shift register circuit of claim 8, wherein the input unit further comprises:
a capacitor electrically connected between the gate and second ends of the transistor.

13. The shift register circuit of claim 8, wherein:
the charging unit comprises:
a first transistor comprising:
a first end electrically connected to the energy-store unit;
a gate end for receiving the second clock; and a second end for receiving a first high power voltage; and
a second transistor comprising:
a first end electrically connected to the first end of the first transistor;
a gate end for receiving the third clock; and
a second end for receiving the first high power voltage; and
the pull-up unit comprises:
a third transistor comprising:
a first end electrically connected to the Nth gate line;
a gate end for receiving the second clock; and
a second end for receiving a second high power voltage less than the first high power voltage; and
a fourth transistor comprising:
a first end electrically connected to the first end of the third transistor;
a gate end for receiving the third clock; and
a second end for receiving the second high power voltage;
wherein the first transistor, the second transistor, the third transistor and the fourth transistor are P-type thin film transistors or P-type field effect transistors.

14. The shift register circuit of claim 8, wherein:
the charging unit comprises:
a first transistor comprising:
a first end electrically connected to the energy-store unit;
a gate end for receiving the second clock; and
a second end for receiving a high power voltage; and
a second transistor comprising:
a first end electrically connected to the first end of the first transistor;
a gate end for receiving the third clock; and
a second end for receiving the high power voltage; and
the pull-up unit comprises:
a third transistor comprising:
a first end electrically connected to the Nth gate line;
a gate end for receiving the second clock; and
a second end for receiving the high power voltage; and
a fourth transistor comprising:
a first end electrically connected to the first end of the third transistor;
a gate end for receiving the third clock; and
a second end for receiving the high power voltage;
wherein the first transistor, the second transistor, the third transistor and the fourth transistor are P-type thin film transistors or P-type field effect transistors.

15. A shift register circuit for providing plural gate signals to plural gate lines, the shift register circuit comprising a plurality of shift register stages, an Nth shift register stage of the shift register stages comprising:
a pull-up unit, electrically connected to an Nth gate line of the gate lines, for pulling up an Nth gate signal of the gate signals according to a driving control voltage and a first clock;
an input unit, electrically connected to the pull-up unit and an (N−1)th shift register stage of the shift register stages, for inputting an (N−1)th gate signal generated by the (N−1)th shift register stage to become the driving control voltage;
an energy-store unit, electrically connected to the pull-up unit and the input unit, for storing the driving control voltage;
a discharging unit for performing an alternate pull-down operation on the driving control voltage according to a second clock and a third clock, the discharging unit comprising:
a first transistor having:
a first end electrically connected to the energy-store unit;
a gate end for receiving the second clock; and
a second end for receiving a first low power voltage; and
a second transistor having:
a first end electrically connected to the first end of the first transistor;
a gate end for receiving the third clock; and
a second end for receiving the first low power voltage; and
a pull-down unit for performing an alternate pull-down operation on the Nth gate signal according to the second clock and the third clock, the pull-down unit comprising:
a third transistor having:
a first end electrically connected to the Nth gate line;
a gate end for receiving the second clock; and
a second end for receiving a second low power voltage greater than the first low power voltage; and
a fourth transistor having:
a first end electrically connected to the first end of the third transistor;
a gate end for receiving the third clock; and
a second end for receiving the second low power voltage;
wherein a pulse rising edge of the first clock, a pulse rising edge of the second clock and a pulse rising edge of the third clock are sequentially staggered.

16. The shift register circuit of claim 15, wherein the first through fourth transistors are N-type thin film transistors or N-type field effect transistors.

17. A shift register circuit for providing plural gate signals to plural gate lines, the shift register circuit comprising a plurality of shift register stages, an Nth shift register stage of the shift register stages comprising:
a pull-down unit, electrically connected to an Nth gate line of the gate lines, for pulling down an Nth gate signal of the gate signals according to a driving control voltage and a first clock;
an input unit, electrically connected to the pull-down unit and an (N−1)th shift register stage of the shift register stages, for inputting an (N−1)th gate signal generated by the (N−1)th shift register stage to become the driving control voltage;
an energy-store unit, electrically connected to the pull-down unit and the input unit, for storing the driving control voltage;
a charging unit for performing an alternate pull-up operation on the driving control voltage according to a second clock and a third clock, the charging unit comprising:
a first transistor having:
a first end electrically connected to the energy-store unit;
a gate end for receiving the second clock; and
a second end for receiving a first high power voltage; and
a second transistor having:
a first end electrically connected to the first end of the first transistor;
a gate end for receiving the third clock; and
a second end for receiving the first high power voltage; and a pull-up unit for performing an alternate pull-up operation on the Nth gate signal according to the second clock and the third clock, the pull-up unit comprising:
  a third transistor comprising:
    a first end electrically connected to the Nth gate line;
    a gate end for receiving the second clock; and
    a second end for receiving a second high power voltage less than the first high power voltage; and
  a fourth transistor comprising:
    a first end electrically connected to the first end of the third transistor;
    a gate end for receiving the third clock; and
    a second end for receiving the second high power voltage;
  wherein a pulse falling edge of the first clock, a pulse falling edge of the second clock and a pulse falling edge of the third clock are sequentially staggered.

18. The shift register circuit of claim 15, wherein the first through fourth transistors are P-type thin film transistors or P-type field effect transistors.

* * * * *